US012622021B2

(12) United States Patent
Motoyama et al.

(10) Patent No.: US 12,622,021 B2
(45) Date of Patent: May 5, 2026

(54) SEMICONDUCTOR STRUCTURE WITH CONDUCTIVE SPACER IN SHALLOW TRENCH ISOLATION REGION

(71) Applicant: International Business Machines Corporation, Armonk, NY (US)

(72) Inventors: Koichi Motoyama, Clifton Park, NY (US); Ruilong Xie, Niskayuna, NY (US); Kisik Choi, Watervliet, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 365 days.

(21) Appl. No.: 17/963,031

(22) Filed: Oct. 10, 2022

(65) Prior Publication Data

US 2024/0120372 A1    Apr. 11, 2024

(51) Int. Cl.
| | |
|---|---|
| *H10D 62/10* | (2025.01) |
| *H10D 30/43* | (2025.01) |
| *H10D 30/67* | (2025.01) |
| *H10W 20/20* | (2026.01) |

(52) U.S. Cl.
CPC ........... *H10D 62/115* (2025.01); *H10D 30/43* (2025.01); *H10D 30/6729* (2025.01); *H10D 30/6757* (2025.01); *H10D 62/121* (2025.01); *H10W 20/20* (2026.01)

(58) Field of Classification Search
CPC .. H10D 62/115; H10D 30/43; H10D 30/6729; H10D 30/6757; H10D 62/121; H10D 30/014; H10D 30/6735; H10D 62/151; H01L 23/481; H01L 21/76895; H01L 21/76898; H01L 23/535; H01L 23/5286
See application file for complete search history.

(56) References Cited

U.S. PATENT DOCUMENTS

| | | | |
|---|---|---|---|
| 8,492,241 B2 | 7/2013 | Cheng et al. | |
| 10,636,739 B2 | 4/2020 | Beyne et al. | |
| 2019/0165118 A1* | 5/2019 | Leobandung | ........ H10D 30/014 |
| 2021/0111115 A1 | 4/2021 | Morrow et al. | |
| 2021/0134721 A1 | 5/2021 | Chiang et al. | |
| 2021/0202385 A1 | 7/2021 | Huang et al. | |
| 2021/0305252 A1 | 9/2021 | Chiang et al. | |
| 2021/0305381 A1 | 9/2021 | Chiang et al. | |
| 2021/0351303 A1 | 11/2021 | Ju et al. | |
| 2021/0376071 A1 | 12/2021 | Liu et al. | |
| 2021/0376093 A1 | 12/2021 | Chu et al. | |
| 2021/0399109 A1 | 12/2021 | Su et al. | |

(Continued)

FOREIGN PATENT DOCUMENTS

EP          3772091 A1     2/2021

OTHER PUBLICATIONS

R. Mathur et al., "Buried Bitline for sub-5nm SRAM Design," IEEE International Electron Devices Meeting (IEDM), Dec. 2020, pp. 20.2.1-20.2.4.

(Continued)

*Primary Examiner* — Mohammad A Rahman
(74) *Attorney, Agent, or Firm* — L. Jeffrey Kelly; Ryan, Mason & Lewis, LLP

(57)          ABSTRACT

A semiconductor structure includes a shallow trench isolation region disposed within a semiconductor substrate, and a conductive spacer disposed within the shallow trench isolation region.

20 Claims, 26 Drawing Sheets

(56) References Cited

U.S. PATENT DOCUMENTS

| | | | |
|---|---|---|---|
| 2022/0020666 A1 | 1/2022 | Van Dal et al. | |
| 2022/0052157 A1 | 2/2022 | Chang et al. | |
| 2022/0157723 A1 | 5/2022 | Park et al. | |
| 2022/0165659 A1 | 5/2022 | Huang et al. | |
| 2022/0238689 A1* | 7/2022 | Yoon | H10D 64/679 |
| 2023/0275090 A1* | 8/2023 | Tzeng | H10D 30/6735 |

OTHER PUBLICATIONS

A. Gupta et al., "Buried Power Rail Scaling and Metal Assessment for the 3 nm Node and Beyond," IEEE International Electron Devices Meeting (IEDM), Dec. 2020, pp. 20.3.1-20.3.3.
D. Prasad et al., "Buried Power Rails and Back-side Power Grids: Arm CPU Power Delivery Network Design Beyond 5nm," 2019 IEEE International Electron Devices Meeting (IEDM), Dec. 7-11, 2019, pp. 19.1.1-19.1.4.

* cited by examiner

SEMICONDUCTOR STRUCTURE WITH CONDUCTIVE SPACER IN SHALLOW TRENCH ISOLATION REGION

BACKGROUND

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor FETs (MOSFETs). Complementary MOS (CMOS) devices are widely used, where both n-type and p-type transistors (nFET and pFET) are used to form logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

SUMMARY

Illustrative embodiments of the present application include techniques for use in semiconductor manufacture. In one illustrative embodiment, a semiconductor structure comprises a shallow trench isolation region disposed within a semiconductor substrate, and a conductive spacer disposed within the shallow trench isolation region.

In another illustrative embodiment, a semiconductor structure comprises a plurality of shallow trench isolation regions disposed within a semiconductor substrate, a conductive spacer disposed within one of the plurality of shallow trench isolation regions, and a via-to-backside power rail disposed on a top surface of the conductive spacer. The conductive spacer has a first width and the via-to-backside power rail has a second width less than the first width.

In yet another illustrative embodiment, a semiconductor structure comprises a plurality of shallow trench isolation regions disposed within a semiconductor substrate, a conductive spacer disposed within one of the plurality of shallow trench isolation regions, a plurality of stacked nanosheet channel layers located above the semiconductor substrate and between respective shallow trench isolation regions, and a via-to-backside power rail disposed on a top surface of the conductive spacer. The conductive spacer has a first width and the via-to-backside power rail has a second width less than the first width.

Other embodiments will be described in the following detailed description of embodiments, which is to be read in conjunction with the accompanying figures.

DETAILED DESCRIPTION

Figure 1:
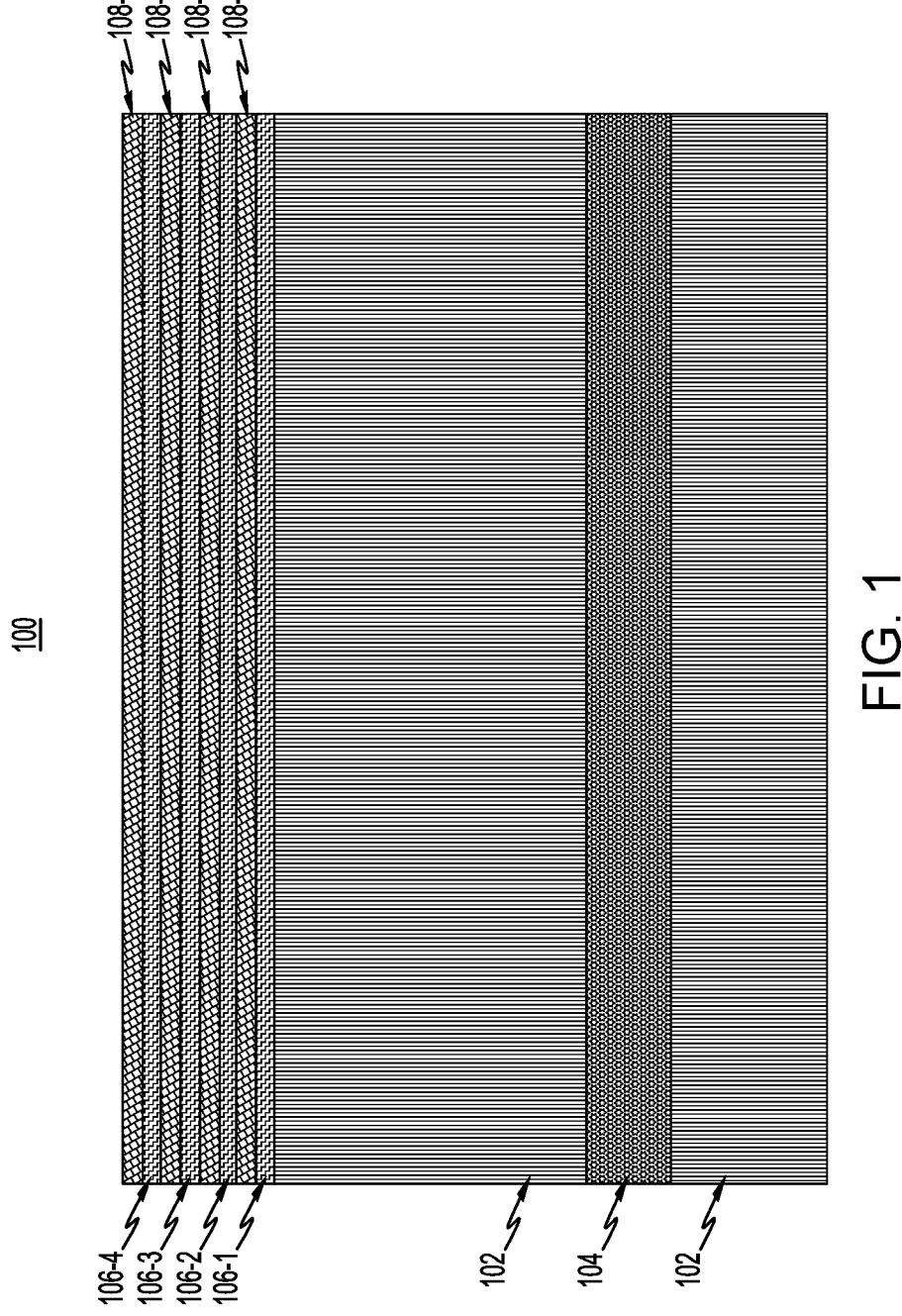
FIG. 1 depicts a cross sectional view illustrating a semiconductor structure for use at a first-intermediate fabrication stage, according to an illustrative embodiment.

Illustrative embodiments of the invention may be described herein in the context of illustrative methods for forming a conductive spacer in a shallow trench region in a semiconductor substrate to provide a larger contact area between a via-to-backside power rail and a backside power rail, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the IC chip fabrication industry, there are three sections referred to in a typical IC chip build: front-end-of-line (FEOL), back-end-of-line (BEOL), and the section that connects those two together, the middle-of-the-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Present semiconductor processing forms a via-to-backside power rail having a relatively high aspect ratio (A/R)

via and thus making it difficult to achieve a void-free metal fill and to carry out a planarization process such as chemical mechanical planarization (CMP) after depositing middle-of-the-line (MOL) contacts. Other drawbacks to the via-to-backside power rail having a relatively high aspect ratio include a short risk between the semiconductor substrate and the via-to-backside power rail. Illustrative embodiments provide methods and structures for overcoming the foregoing drawbacks by forming a conductive spacer as discussed below in a shallow trench region in a semiconductor substrate to provide a larger contact area between a via-to-backside power rail and a backside power rail.

Referring now to FIGS. 1-16 in accordance with an illustrative embodiment, FIG. 1 shows a semiconductor structure 100 having substrate 102 and etch stop layer 104 formed in the substrate 102. The substrate 102 may be formed of any suitable semiconductor structure, including various silicon-containing materials including but not limited to silicon (Si), silicon germanium (SiGe), silicon germanium carbide (SiGeC), silicon carbide (SiC) and multilayers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon. The etch stop layer 104 may comprise a buried oxide (BOX) layer or silicon germanium (SiGe), or another suitable material such as a III-V semiconductor epitaxial layer.

Nanosheets are formed over the substrate 102, where the nanosheets include sacrificial layers 106-1, 106-2, 106-3 and 106-4 (collectively, sacrificial layers 106), and nanosheet channel layers 108-1, 108-2, 108-3 and 108-4 (collectively, nanosheet channel layers 108).

The sacrificial layers 106 are illustratively formed of a sacrificial material, such that they may be etched or otherwise removed selectively. In some embodiments, the sacrificial layers 106 are formed of SiGe. For example, the sacrificial layers 106 may have a relatively higher percentage of Ge (e.g., 55% Ge) or a relatively lower percentage of Ge (e.g., 25% Ge).

The nanosheet channel layers 108 may be formed of Si or another suitable material (e.g., a material similar to that used for the substrate 102).

Although four layers each of the sacrificial layers 106 and the nanosheet channel layers 108 are shown, the number of sacrificial layers 106 and the nanosheet channel layers 108 should not be considered limiting and any number are contemplated.

Figure 2:
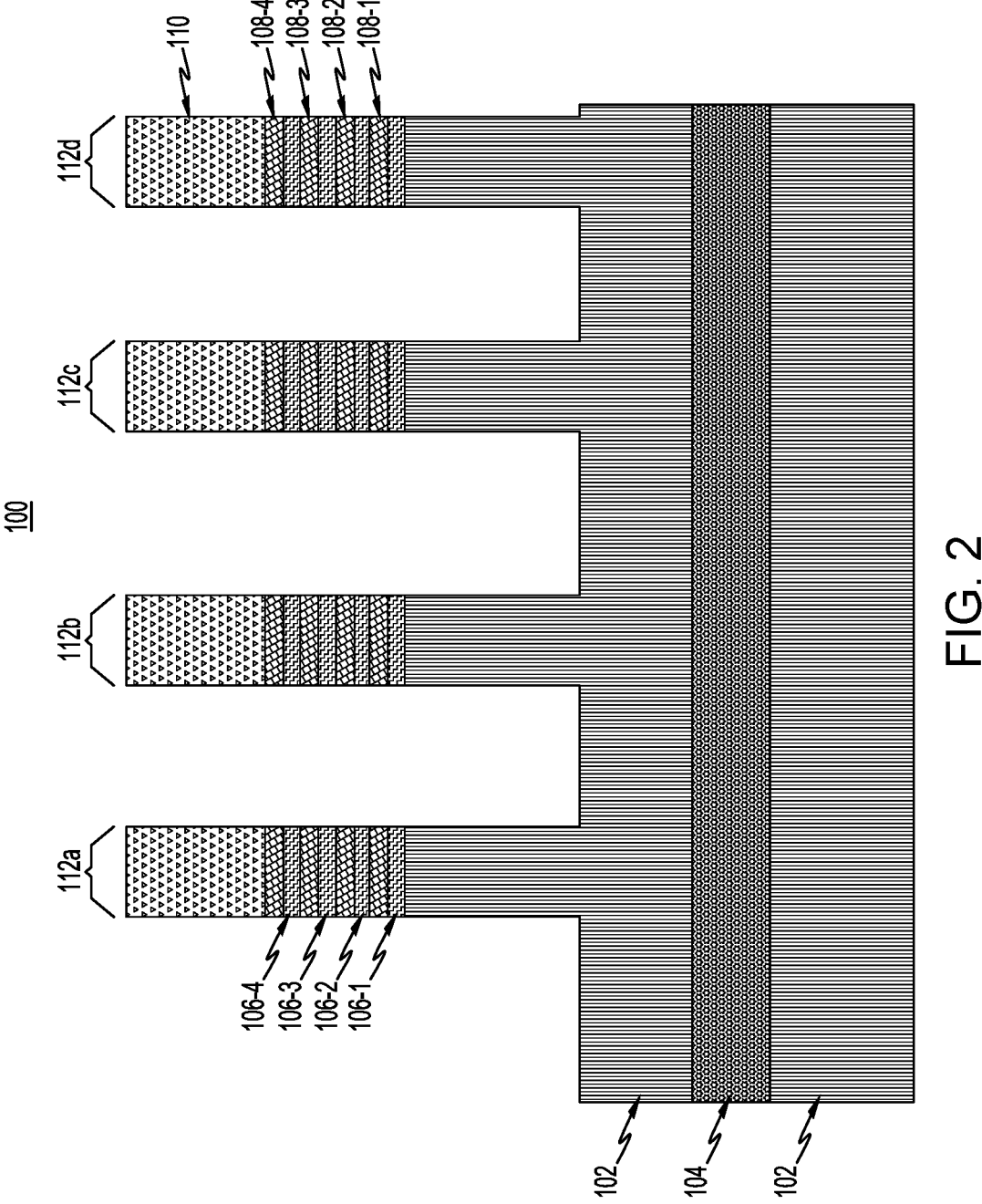
FIG. 2 depicts a side cross-sectional view of a semiconductor structure for use at a second-intermediate fabrication stage, according to an illustrative embodiment.
Figure 3:
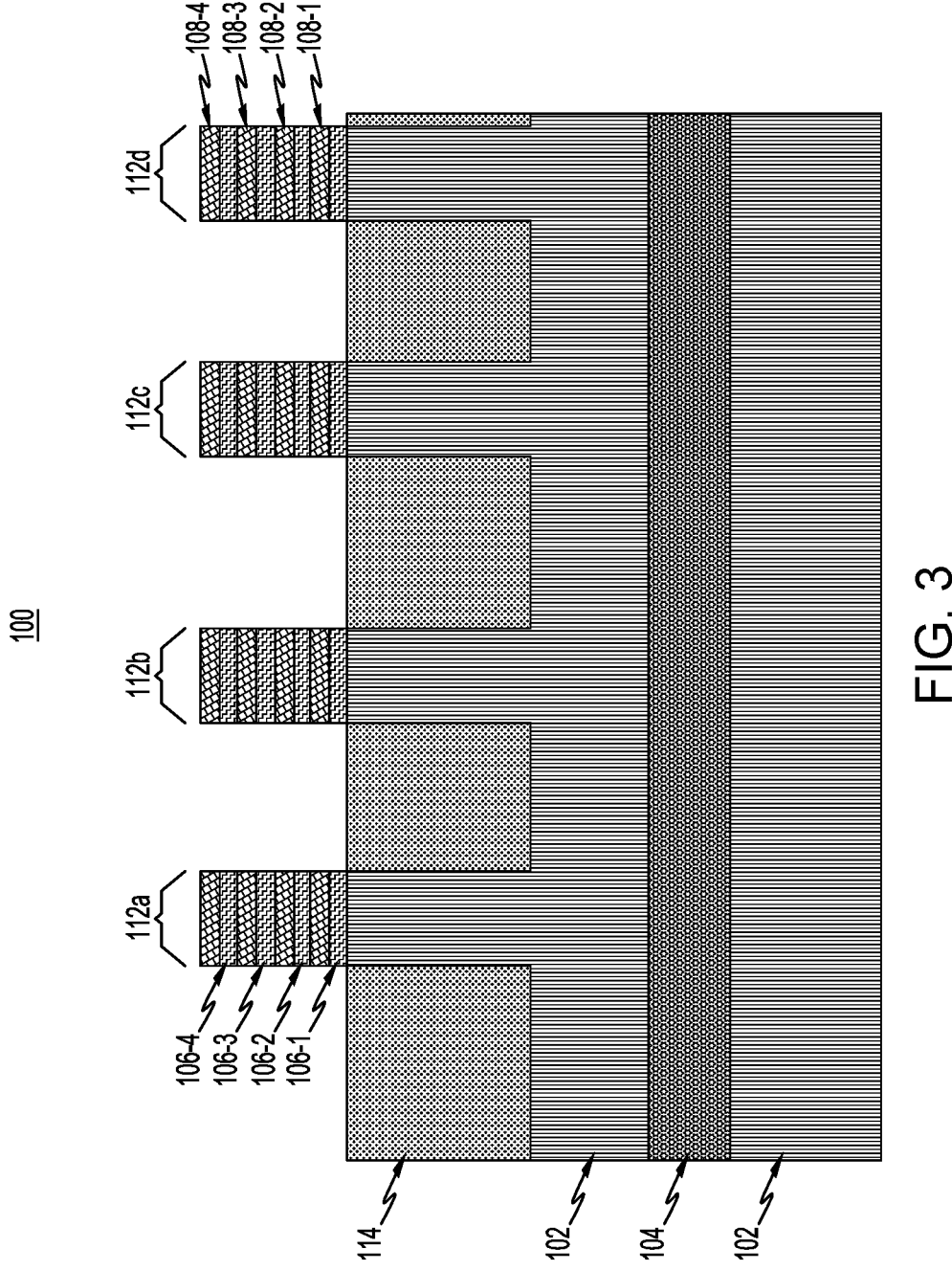
FIG. 3 depicts a side cross-sectional view of a semiconductor structure for use at a third-intermediate fabrication stage, according to an illustrative embodiment.

FIGS. 2 and 3 show a semiconductor structure 100 at a second-intermediate and third-intermediate fabrication stage. During these stages, nanosheet patterning and formation of FET stacks 112a, 112b, 112c and 112d together with shallow trench isolation (STI) regions 114 are carried out. Each of FET stacks 112a, 112b, 112c and 112d contain a respective FET device. However, this is merely illustrative and it is contemplated that FET stacks 112a, 112b, 112c and 112d can contain any number of FET devices. The FET stacks 112a, 112b, 112c and 112d may comprise nFET devices or pFET devices or combinations thereof.

The STI region 114 may be formed by patterning a hardmask layer 110 over the semiconductor structure 100, followed by etching exposed portions of the nanosheet channel layers 108, the sacrificial layers 106, and through a portion of the substrate 102. Hardmask layer 110 can be composed of a flowable organic material such as, for example, a spin-on-carbon (SOC). The STI regions 114 may be formed of a dielectric material such as silicon dioxide ($SiO_2$), silicon oxycarbide (SiOC), silicon oxynitride (SiON), etc. After STI regions 114 are formed, hardmask layer 110 is removed using conventional etching techniques such as reactive ion etching (RIE).

Figure 4:
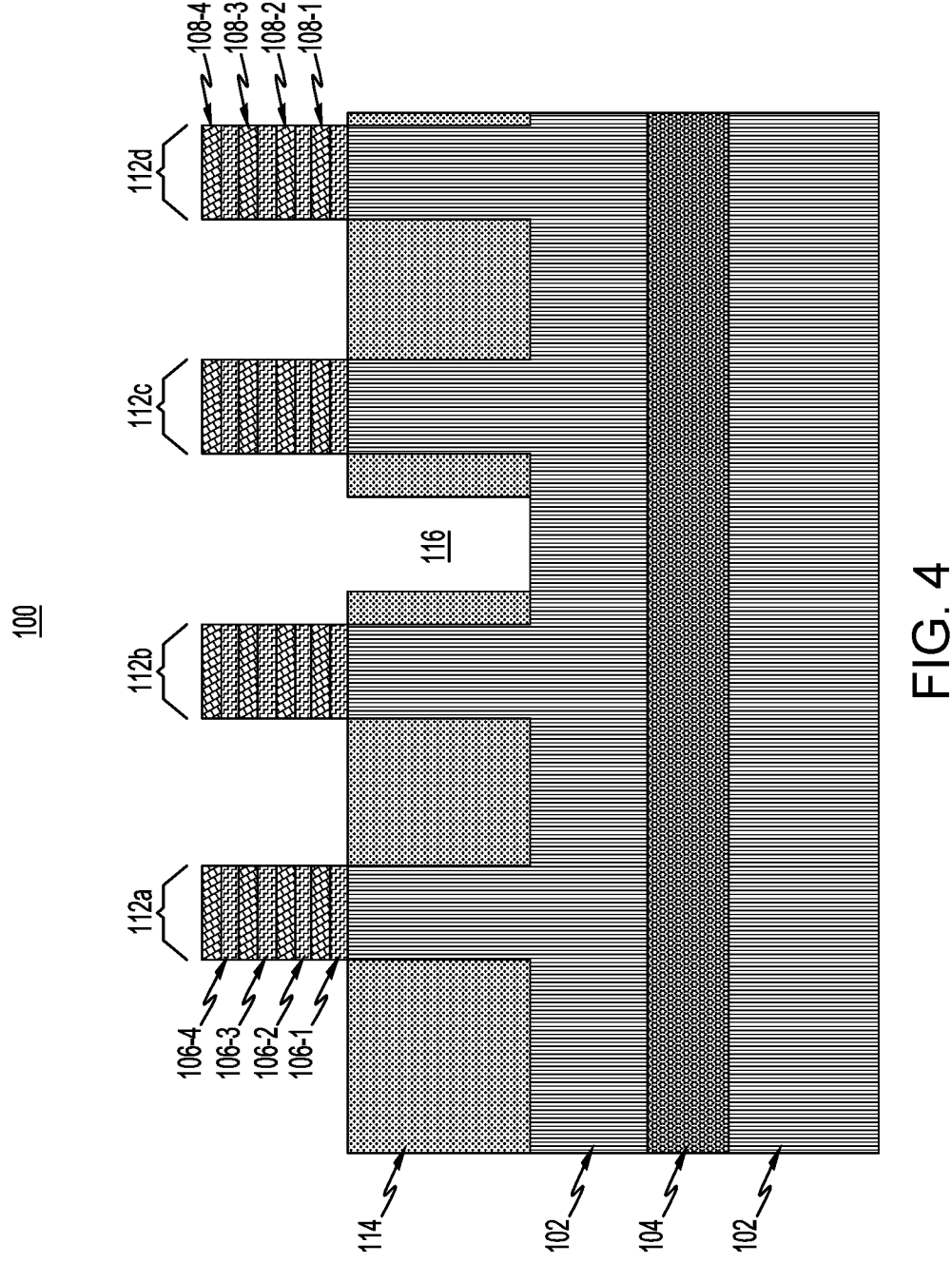
FIG. 4 depicts a side cross-sectional view of a semiconductor structure for use at a fourth-intermediate fabrication stage, according to an illustrative embodiment.

FIG. 4 shows semiconductor structure 100 at a fourth-intermediate fabrication stage. During this stage, a via 116 is formed in one of STI regions 114 between adjacent FET stacks utilizing a selective etching technique such as a wet or dry etch. For example, a masking layer (such as an organic planarization layer (OPL) can be deposited on semiconductor structure 100 using any conventional deposition process such as such as physical vapor deposition (PVD), atomic layer deposition (ALD), chemical vapor deposition (CVD) and/or plating. Next, the masking layer is patterned and then selectively etched to form via 116.

Figure 5:
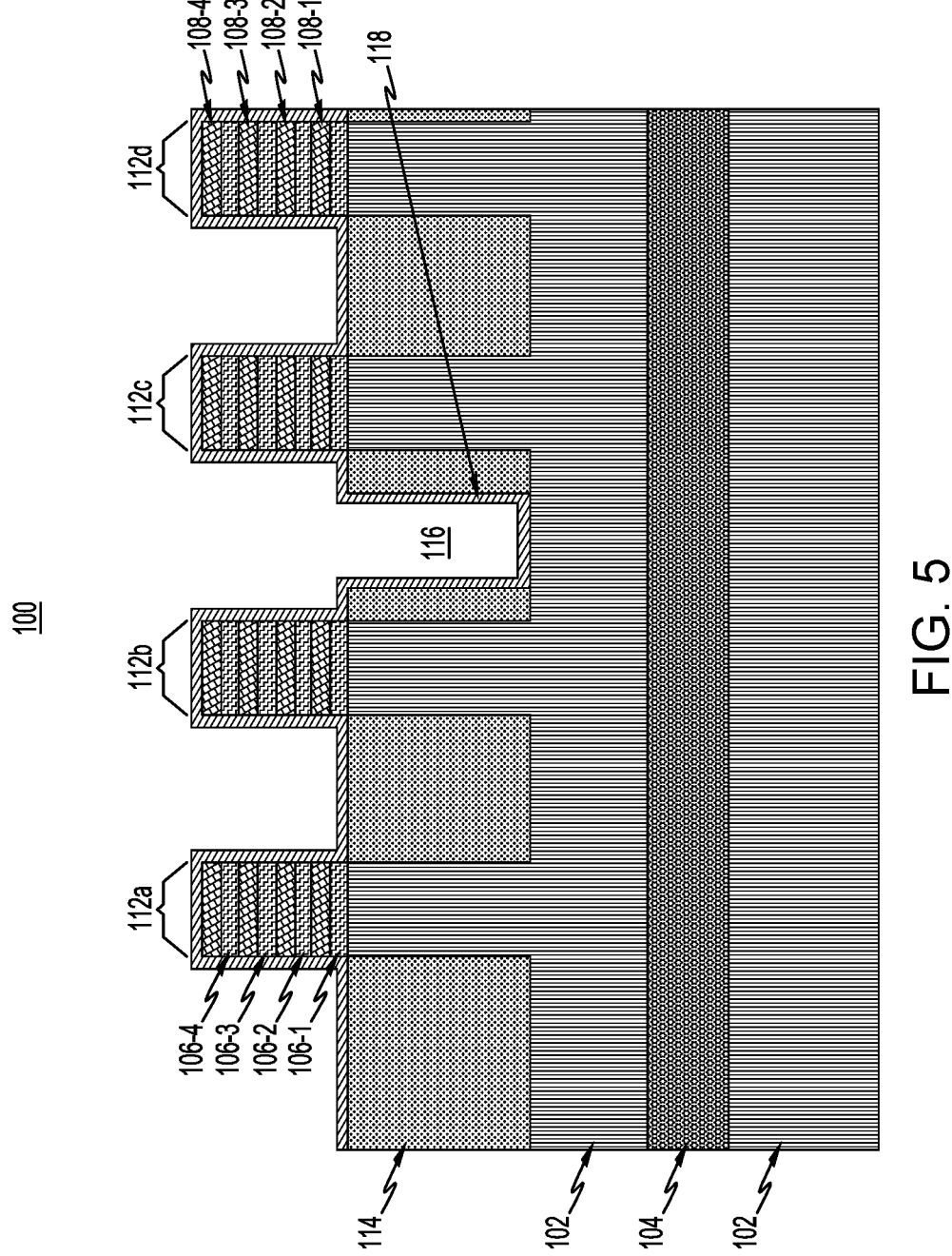
FIG. 5 depicts a side cross-sectional view of a semiconductor structure for use at a fifth-intermediate fabrication stage, according to an illustrative embodiment.

FIG. 5 shows semiconductor structure 100 at a fifth-intermediate fabrication stage. During this stage, a liner layer 118 is deposited on the exterior surfaces of via 116, STI regions 114 and FET stacks 112a, 112b, 112c and 112d using conventional deposition techniques such as PVD, ALD and CVD. The liner layer 118 may be formed of any suitable sacrificial material such as SiN, SiCN, $SiO_2$, and AlOx.

Figure 6:
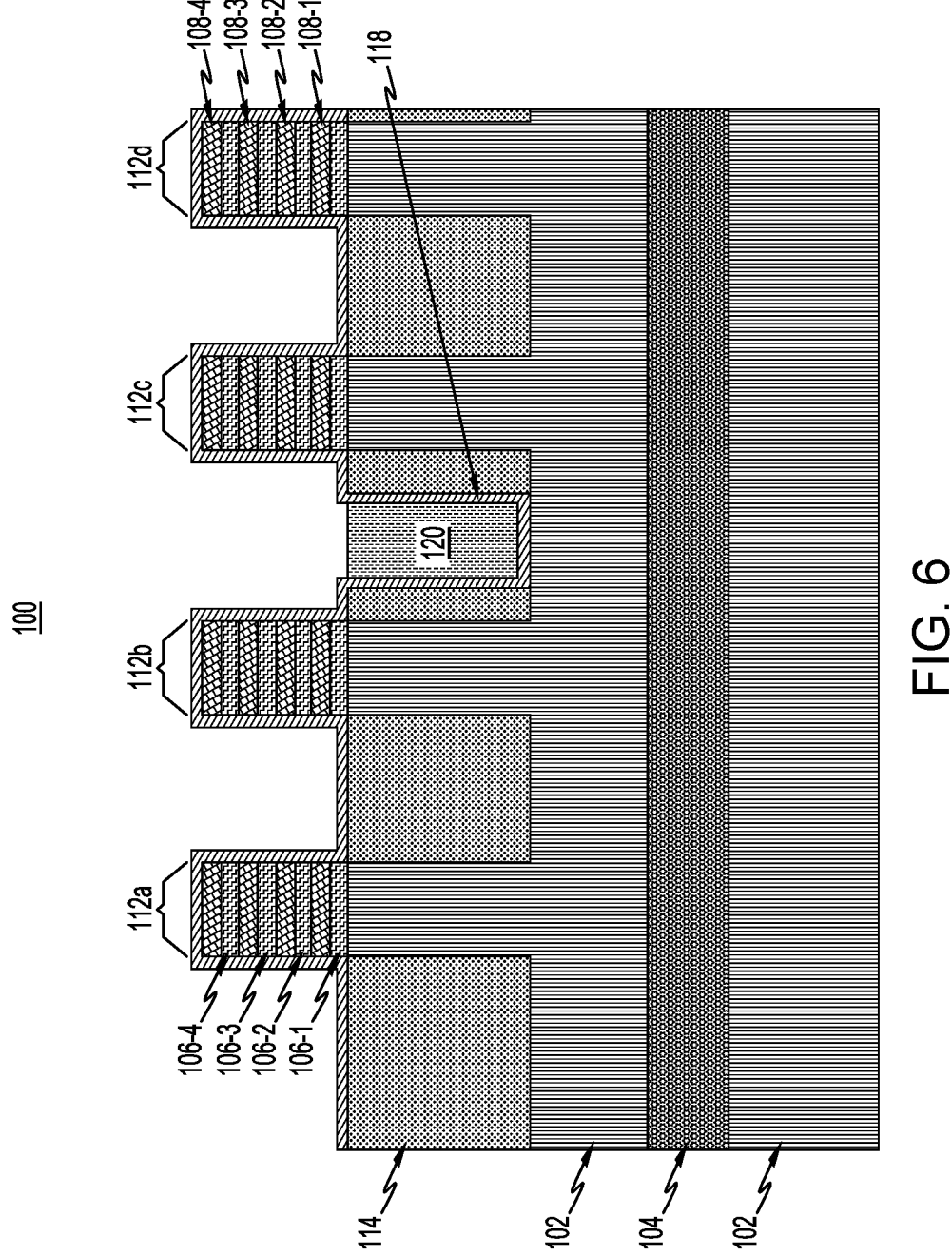
FIG. 6 depicts a side cross-sectional view of a semiconductor structure for use at a sixth-intermediate fabrication stage, according to an illustrative embodiment.

FIG. 6 shows semiconductor structure 100 at a sixth-intermediate fabrication stage. During this stage, a conductive spacer 120 is formed on liner layer 118 in via 116 using conventional deposition techniques such as PVD, ALD, CVD. Conductive spacer 120 can be made of any suitable conductive material such as, for example, platinum (Pt), cobalt (Co), ruthenium (Ru), iridium (Ir), molybdenum (Mo), or any other suitable conductive material. In some embodiments, conductive spacer 120 is formed from ruthenium. The conductive spacer 120 can be tuned to any desired width by adjusting the width of the STI region 114 when forming via 116. In some embodiments, the conductive spacer 120 is formed to a width of 10 nanometers (nm) to 100 nm. As discussed below, the width of conductive spacer 120 will be greater than a width of VBPR 130.

Figure 7:
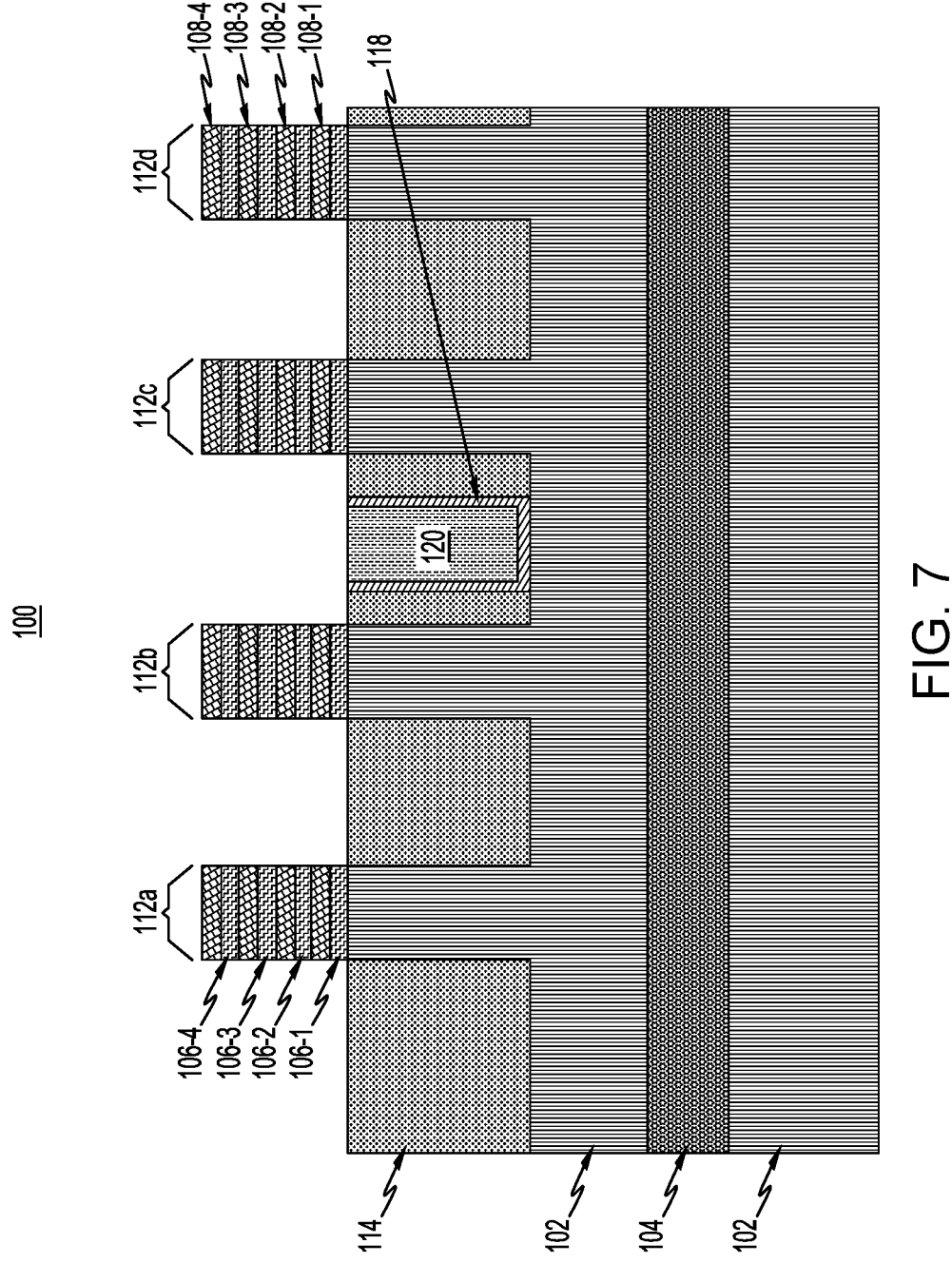
FIG. 7 depicts a side cross-sectional view of a semiconductor structure for use at a seventh-intermediate fabrication stage, according to an illustrative embodiment.

FIG. 7 shows semiconductor structure 100 at a seventh-intermediate fabrication stage. During this stage, the exposed portion of liner layer 118 is removed using a suitable etchback technique such as an isotropic etching process.

Figure 8:
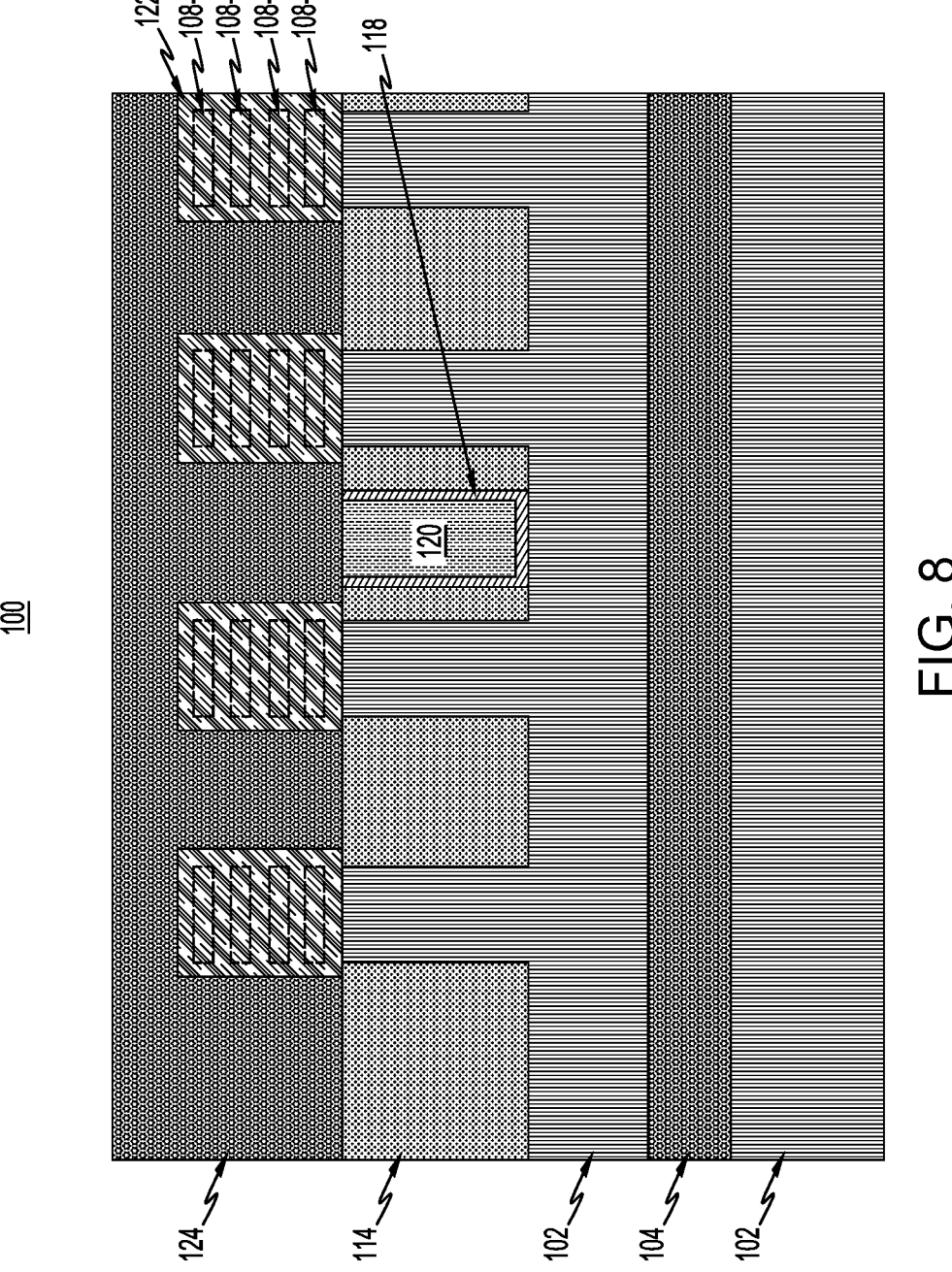
FIG. 8 depicts a side cross-sectional view of a semiconductor structure for use at an eighth-intermediate fabrication stage, according to an illustrative embodiment.

FIG. 8 shows semiconductor structure 100 at an eighth-intermediate fabrication stage. During this stage, various FEOL processing steps not detailed in the present context are carried to form a FEOL structure that includes source/drain regions 122 and an interlayer dielectric (TLD) layer 124 following removal of sacrificial layers 106. In illustrative embodiments, source/drain regions 122 may be formed over nanosheet channel layers 108 using epitaxial growth processes. The source/drain regions 122 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). In some embodiments, the epitaxy process comprises in-situ doping (dopants are incorporated in epitaxy material during epitaxy).

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

The ILD layer 124 is formed on source/drain regions 122 and over the top of the STI regions 114 by conventional deposition processes such as PVD, ALD, CVD and/or plating. The ILD layer 124 may be formed of any suitable isolating material, such as $SiO_2$, SiOC, SiON, etc.

Figure 9:
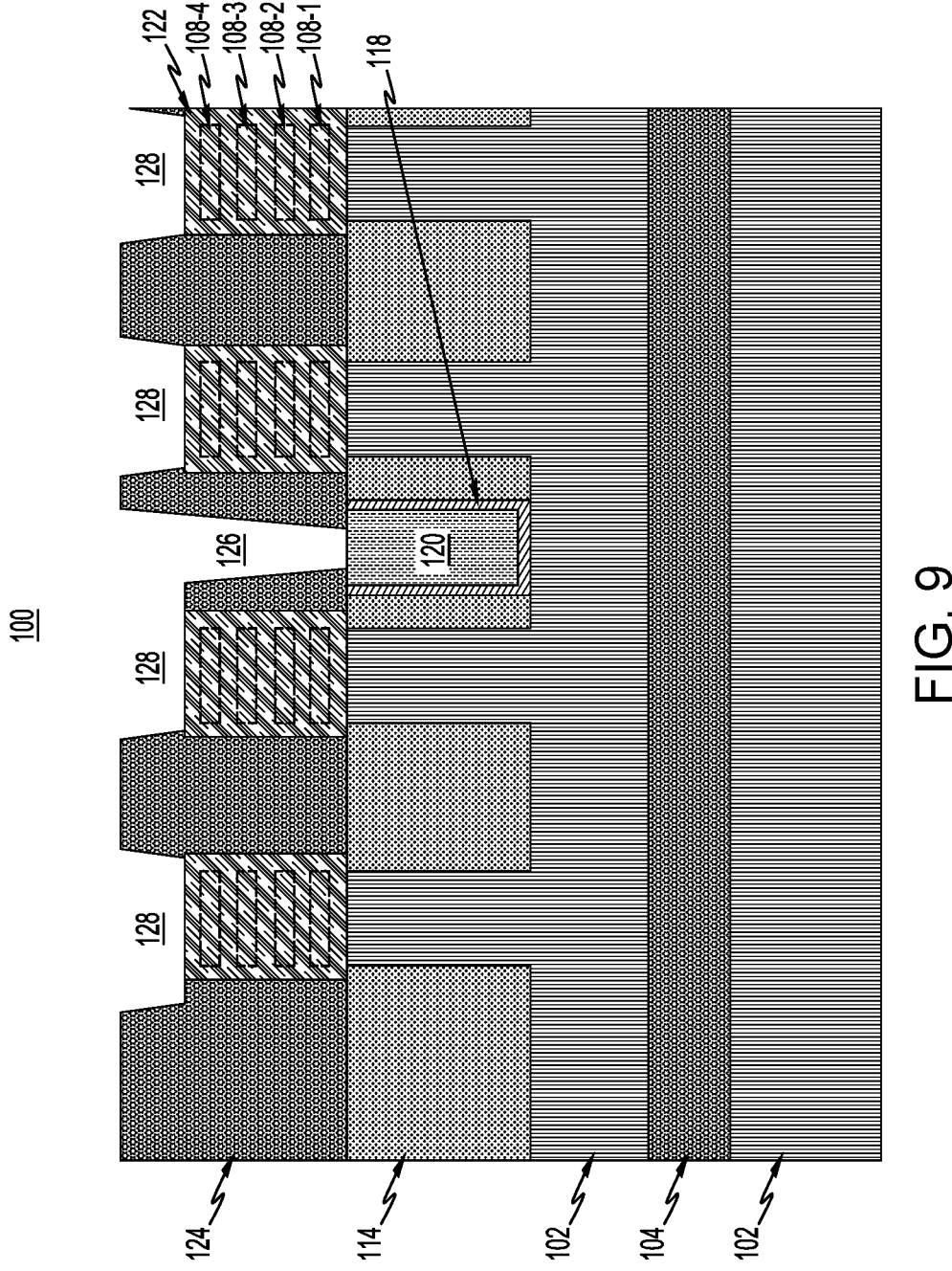
FIG. 9 depicts a cross-sectional view of a semiconductor structure for use at a ninth-intermediate fabrication stage, according to an illustrative embodiment.

FIG. 9 shows semiconductor structure 100 at a ninth-intermediate fabrication stage. During this stage, via-to-backside power rail (VBPR) opening 126 and middle-of-the-line contact openings 128 are formed in ILD layer 124. For example, a masking layer (such as an OPL) can be deposited on ILD layer 124 using any conventional deposition process such as PVD, ALD and CVD. The masking layer can be composed of a flowable organic material such as, for example, a spin-on-carbon (SOC). Next, the masking layer is patterned and then selectively etched to form VBPR opening 126 and middle-of-the-line contact openings 128.

Figure 10A:
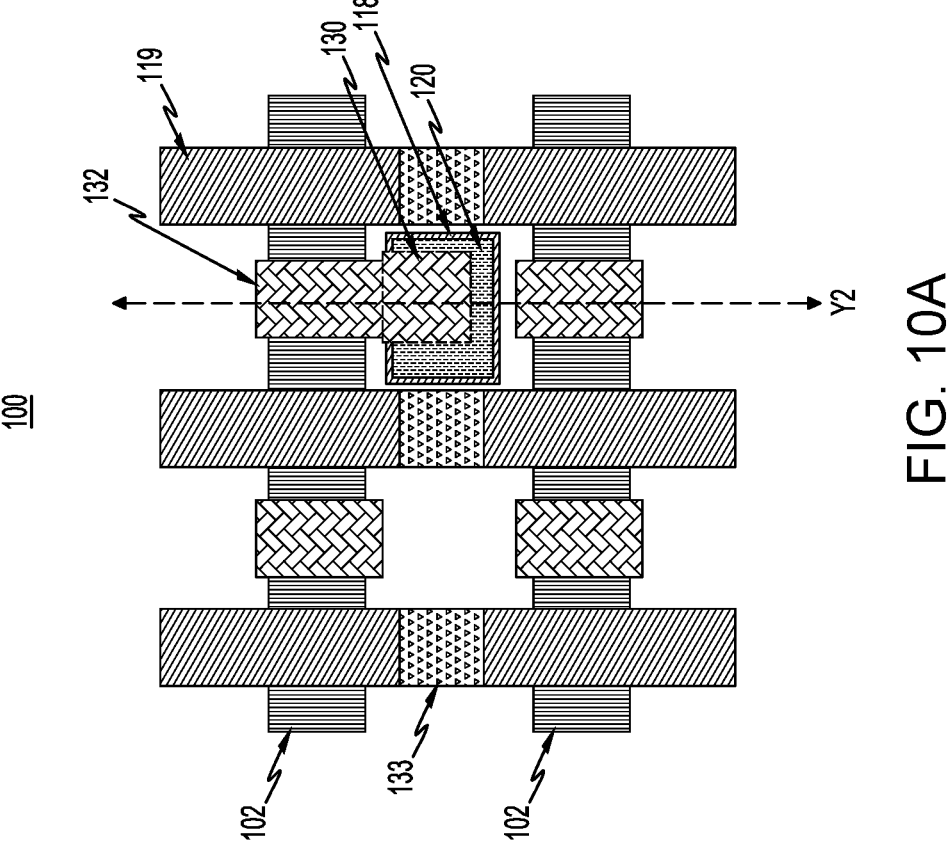
FIG. 10A depicts a top view of a semiconductor structure for use at a tenth-intermediate fabrication stage, according to an illustrative embodiment.
Figure 10B:
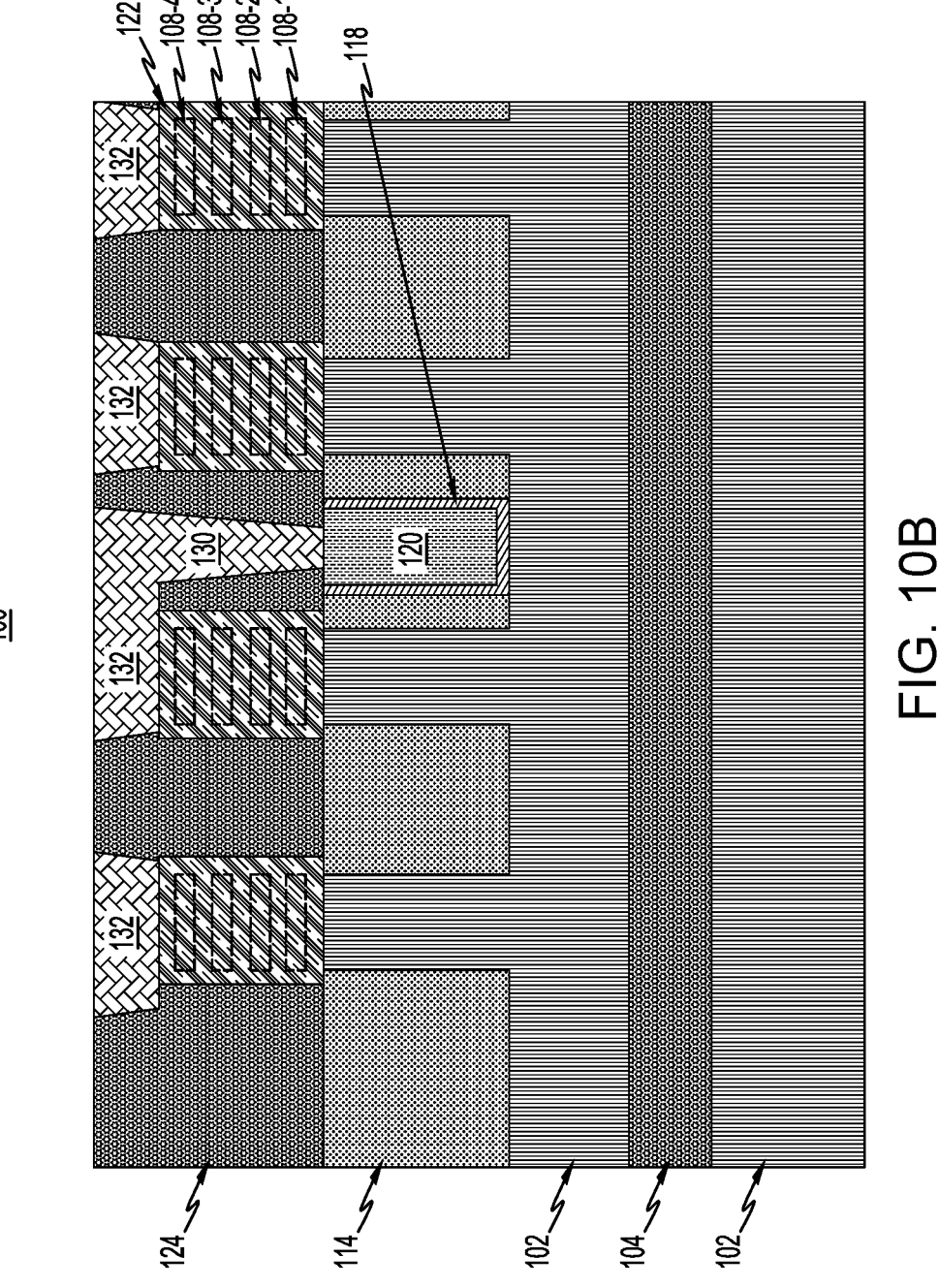
FIG. 10B depicts a cross-sectional view of the semiconductor structure taken along the Y2-Y2 axis of FIG. 10A for use at the tenth-intermediate fabrication stage, according to an illustrative embodiment.

FIGS. 10A and 10B show semiconductor structure 100 at a tenth-intermediate fabrication stage. During this stage, VBPR 130, source/drain contacts 132 and middle-of-the contacts 133 are formed by deposition of a conductive metal. The conductive metal is deposited by conventional deposition processes such as PVD, ALD, CVD, and/or plating. Alternatively, it can be a bottom-up selective metal growth process from VBPR 130. The conductive metal can be any of those discussed above. As depicted in FIG. 10A, a width of conductive spacer 120 is greater than a width of VBPR 130. In addition, FIG. 10A further shows conductive spacer 120 being away, i.e., not under, a gate structure 119.

Figure 11:
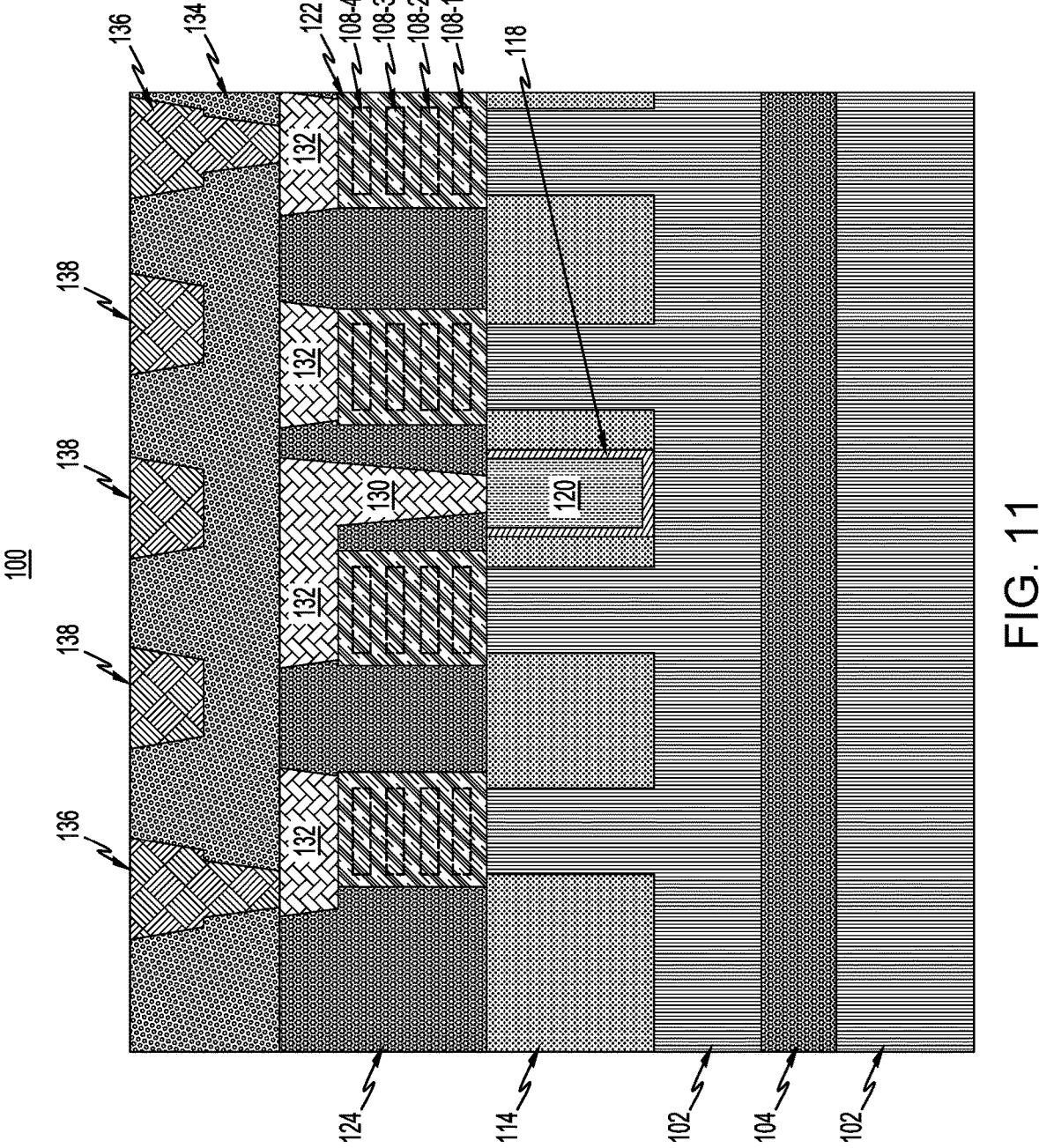
FIG. 11 depicts a side cross-sectional view of a semiconductor structure for use at an eleventh-intermediate fabrication stage, according to an illustrative embodiment.

FIG. 11 shows semiconductor structure 100 at an eleventh-intermediate fabrication stage following the formation of the middle-of-the-line contacts (MOL). During this stage, ILD layer 134 is first deposited on semiconductor structure 100, followed by patterning and etching vias in the exposed ILD layer 134. A suitable conductive metal is then deposited in the vias to form metal via 136 and can be any conductive metal as discussed above. Conductive lines 138 are formed in ILD layer 134, the conductive lines 138 being a power line connected to the semiconductor structure 100 through the metal via and source/drain contacts 132.

Figure 12:
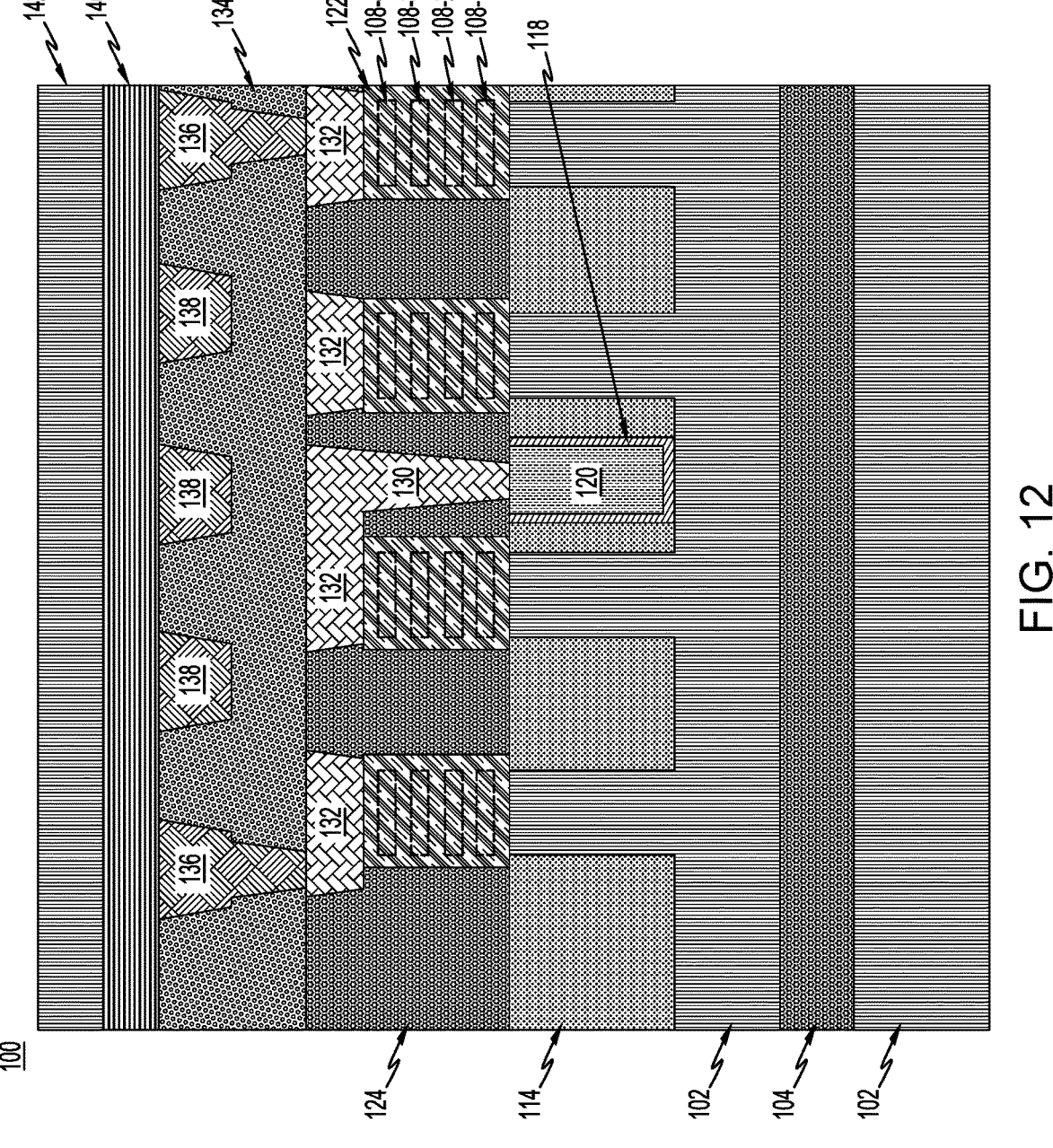
FIG. 12 is a cross-sectional view illustrating the semiconductor structure at a twelfth-intermediate fabrication stage, according to an illustrative embodiment.

FIG. 12 shows semiconductor structure 100 at an eleventh-intermediate fabrication stage. During this stage, frontside back-end-of-line (BEOL) interconnect 140 is formed followed by bonding of the structure (e.g., the frontside BEOL interconnect 140) to a carrier wafer 142. The frontside BEOL interconnect 140 includes various BEOL interconnect structures. For example, frontside BEOL interconnect 140 is a metallization structure that includes one or more metal layers disposed on a side of semiconductor structure 100 opposite of the side on which the backside BEOL metallization structure is disposed. The metal layers of the frontside BEOL interconnect 140 each have metal lines for making interconnections to the semiconductor device.

The carrier wafer 142 may be formed of materials similar to that of the substrate 102, and may be formed over the frontside BEOL interconnect 140 using a wafer bonding process, such as dielectric-to-dielectric bonding.

Figure 13:
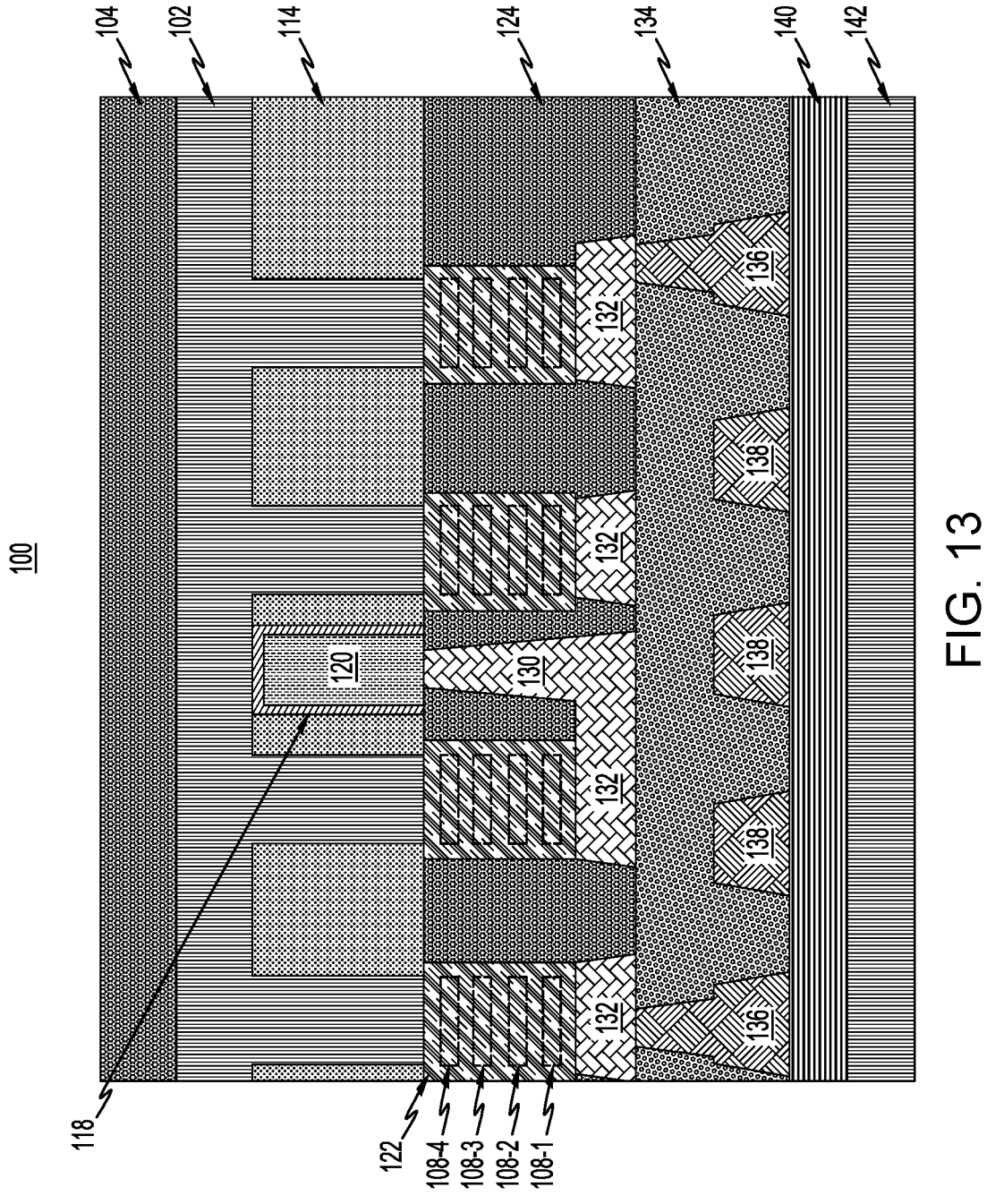
FIG. 13 is a cross-sectional view illustrating the semiconductor structure at a thirteenth-intermediate fabrication stage, according to an illustrative embodiment.

FIG. 13 shows semiconductor structure 100 at a thirteenth-intermediate fabrication stage. During this stage, using the carrier wafer 142, the structure is "flipped" over so that the backside of the substrate 102 (i.e., the back surface) is facing up for backside processing as shown. Next, portions of the substrate 102 may be removed from the backside using, for example, a wet etch to selectively remove substrate 102 until the etch stop layer 104 is reached.

Figure 14:
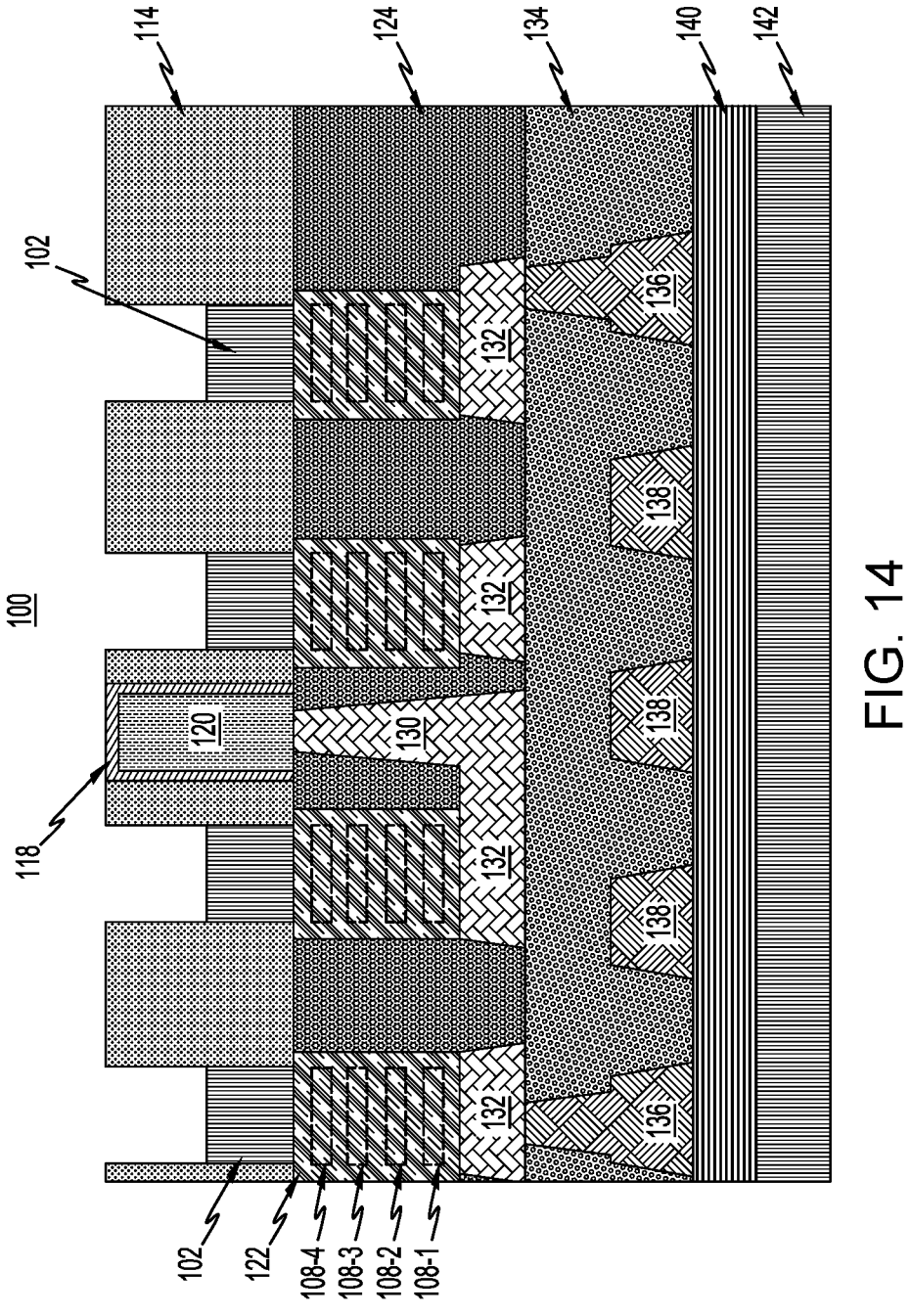
FIG. 14 is a cross-sectional view illustrating the semiconductor structure at a fourteenth-intermediate fabrication stage, according to an illustrative embodiment.

FIG. 14 shows semiconductor structure 100 at a fourteenth-intermediate fabrication stage. During this stage, the etch stop layer 104 is selectively removed using, for example, a wet etch to selectively remove etch stop layer 104 until substrate 102 is reached. The remaining portions of the substrate 102 are removed utilizing a selective etch process such as a wet etch.

Figure 15:
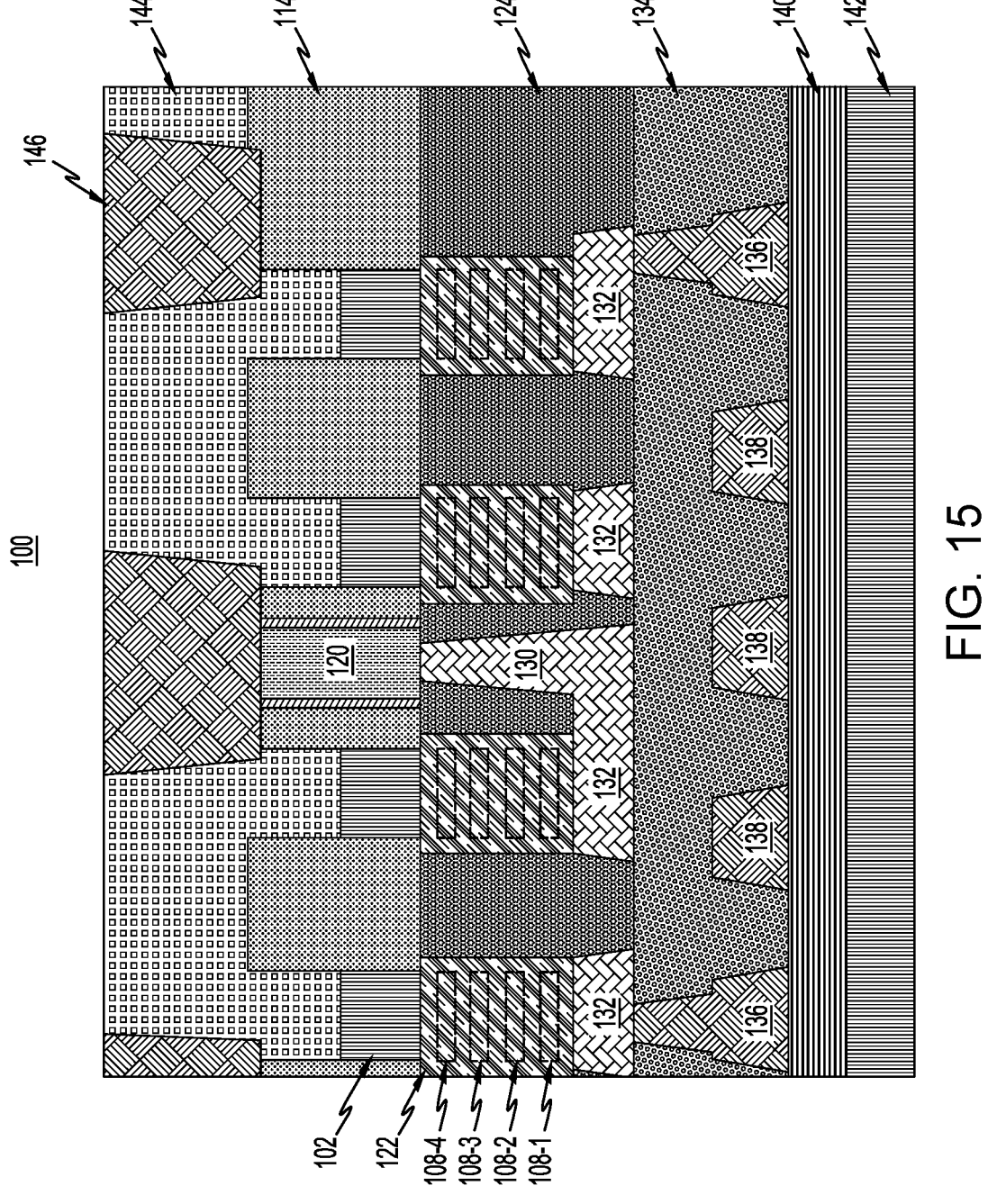
FIG. 15 is a cross-sectional view illustrating the semiconductor structure at a fifteenth-intermediate fabrication stage, according to an illustrative embodiment.

FIG. 15 shows semiconductor structure 100 at a fifteenth-intermediate fabrication stage. During this stage, backside ILD layer 144 may be formed of similar processes and material as ILD layer 124. The material of the backside ILD layer 144 may initially be overfilled, followed by planarization (e.g., using CMP). Next, backside power rails 146 is formed in backside ILD layer 144 by first patterning and etching vias in the exposed backside ILD layer 144. A suitable conductive metal is then deposited in the vias and on top of backside ILD layer 144, followed by CMP to remove any metal on top of backside ILD layer 144. A suitable conductive metal can be any of the metals discussed above.

Figure 16:
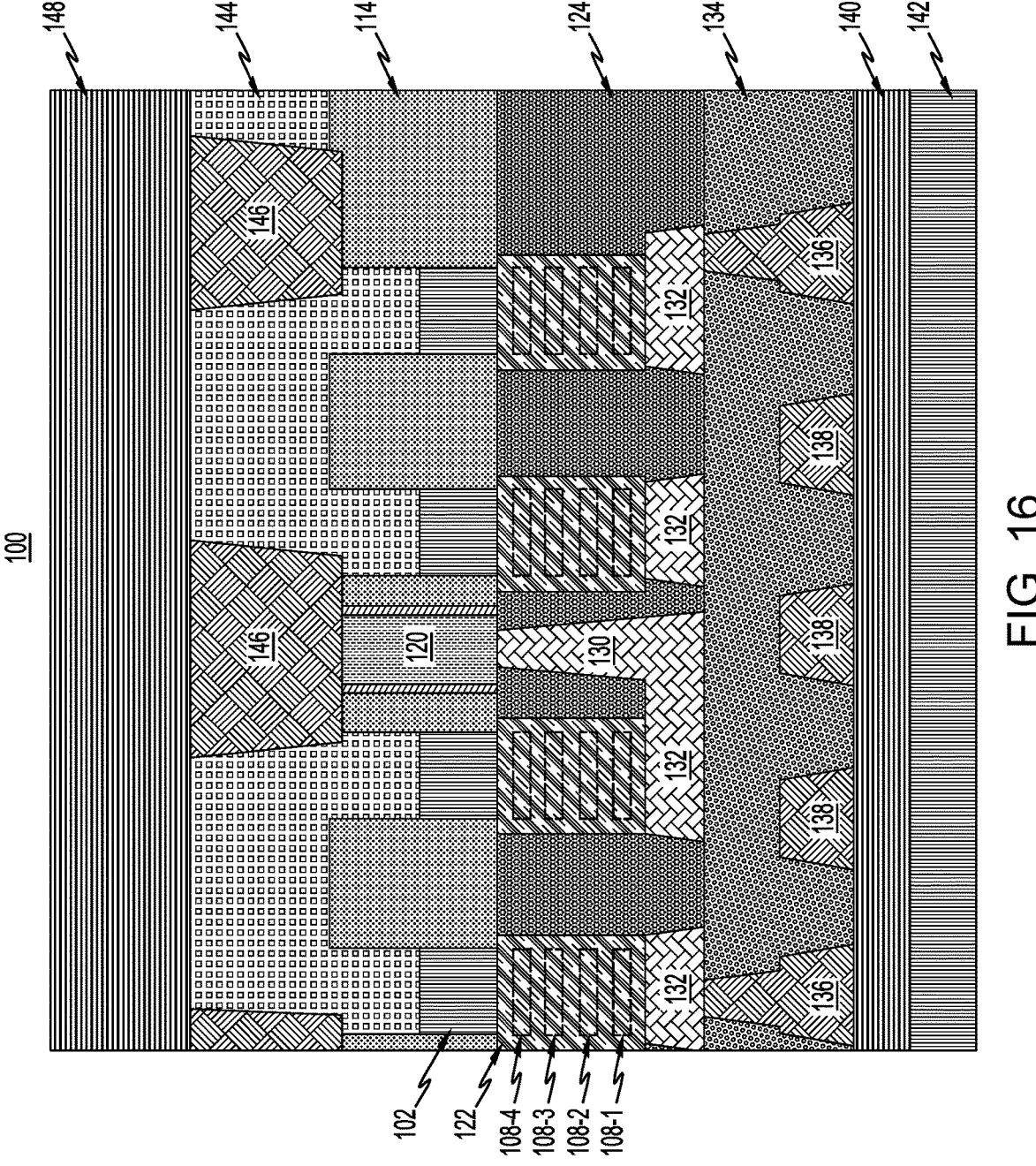
FIG. 16 depicts a side cross-sectional view of a semiconductor structure for use at a sixteenth-intermediate fabrication stage, according to an illustrative embodiment.

FIG. 16 shows semiconductor structure 100 at a sixteenth-intermediate fabrication stage. During this stage, backside power delivery network 148 is formed over the structure including backside power rails 146 and is based on creation of a wiring scheme that is disposed on both sides of the device layer (front end of line structure). For example, the power signals can be routed through a backside power delivery network 148 of metal lines coupled to the semiconductor structure to provide power to a number of semiconductor devices.

Figure 17:
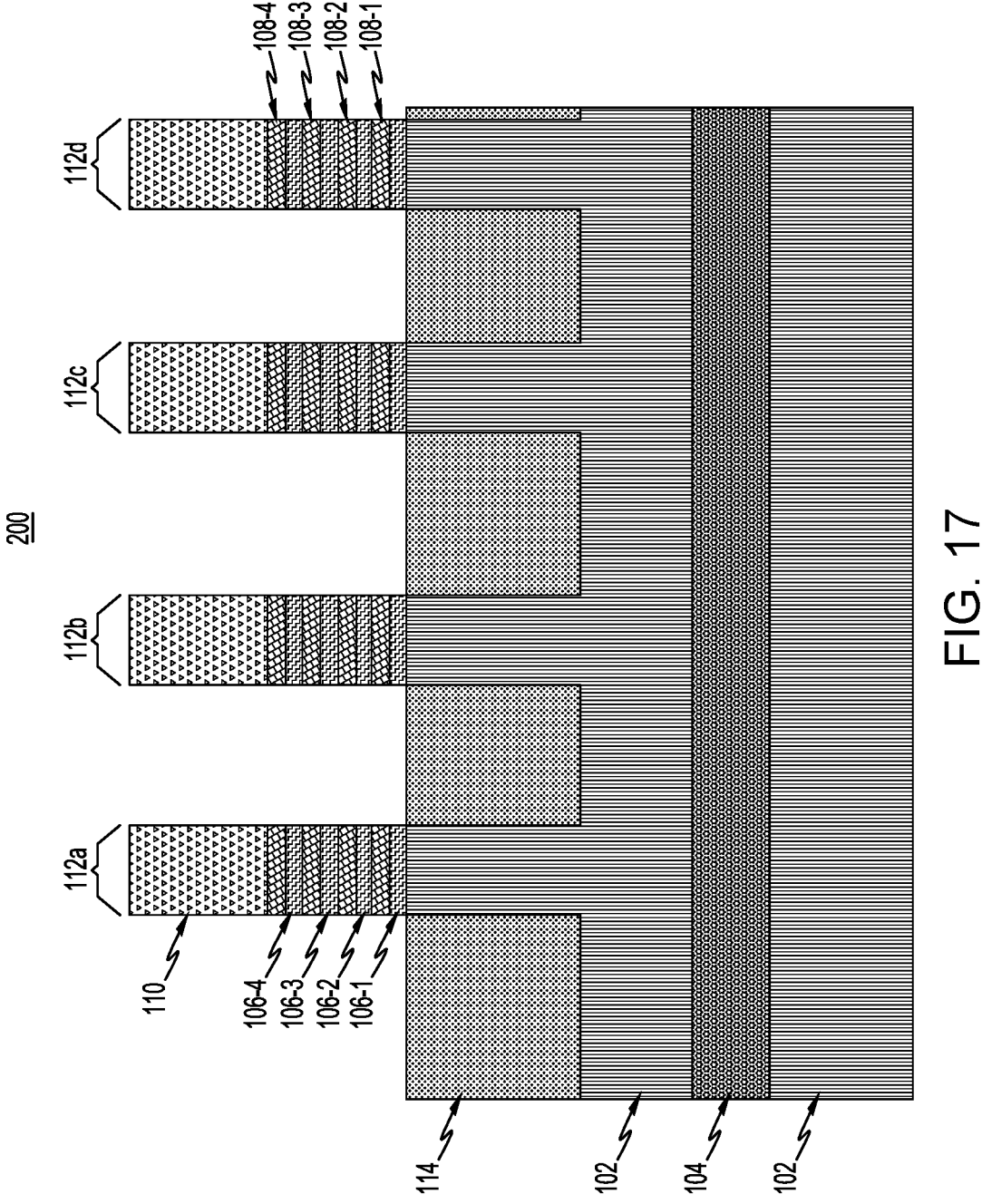
FIG. 17 depicts a side cross-sectional view of a semiconductor structure starting from FIG. 2 for use at a first-intermediate fabrication stage, according to an illustrative alternative embodiment.

Referring now to FIGS. 17-23 illustrating an alternative non-limiting illustrative embodiment starting from FIG. 2, FIG. 17 illustrates semiconductor structure 200 at a first-intermediate fabrication stage. During this stage, following nanosheet patterning and formation of FET stacks 112a, 112b, 112c and 112d, STI regions 114 are formed as discussed above.

Figure 18:
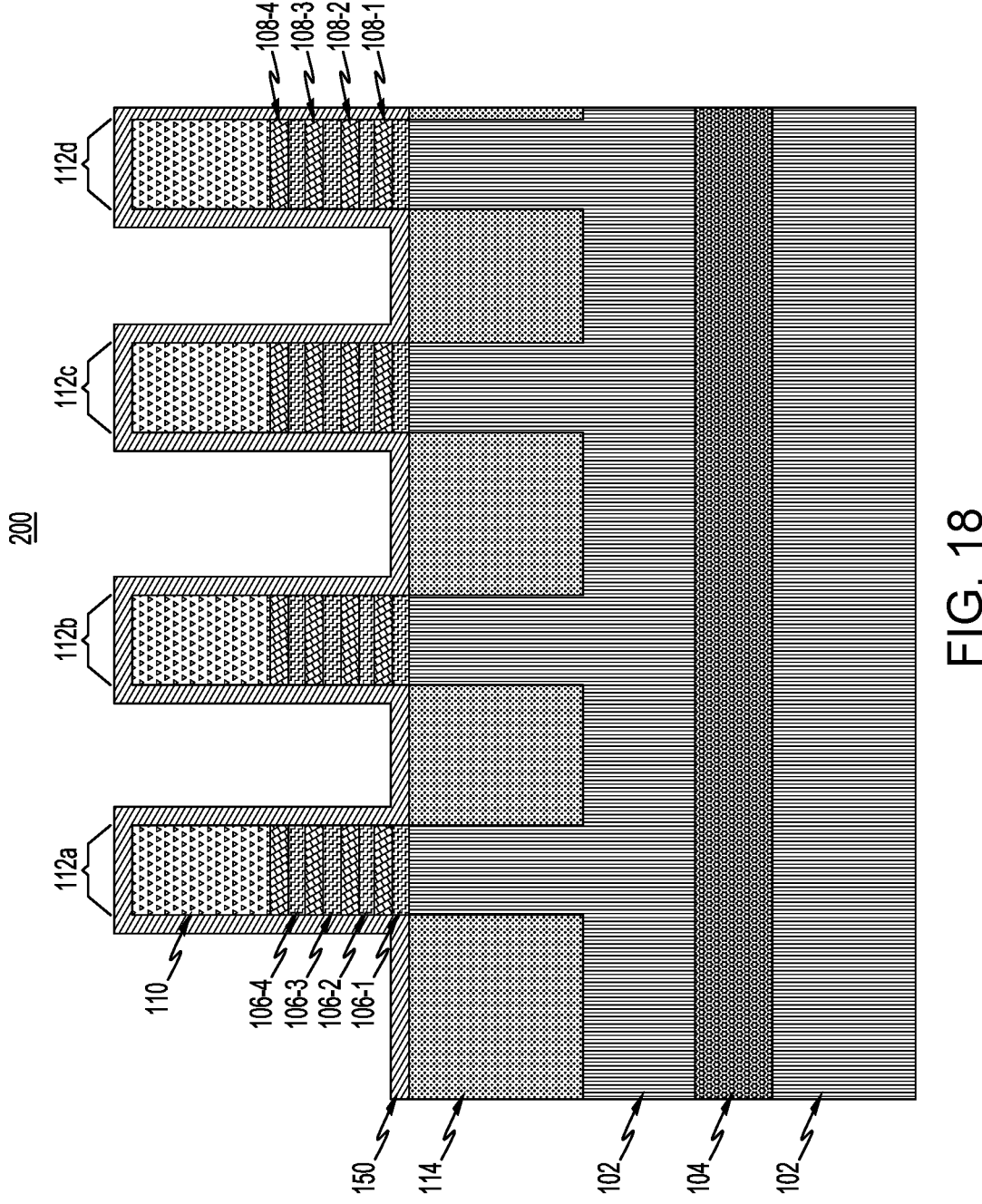
FIG. 18 depicts a side cross-sectional view of a semiconductor structure for use at a second-intermediate fabrication stage, according to the illustrative alternative embodiment.

FIG. 18 shows semiconductor structure 200 at a second-intermediate fabrication stage. During this stage, liner layer 150 is deposited on exterior surfaces of FET stacks 112a, 112b, 112c and 112d and on STI regions 114. Liner layer 150 can be deposited by similar processes and of similar material as liner layer 118.

Figure 19:
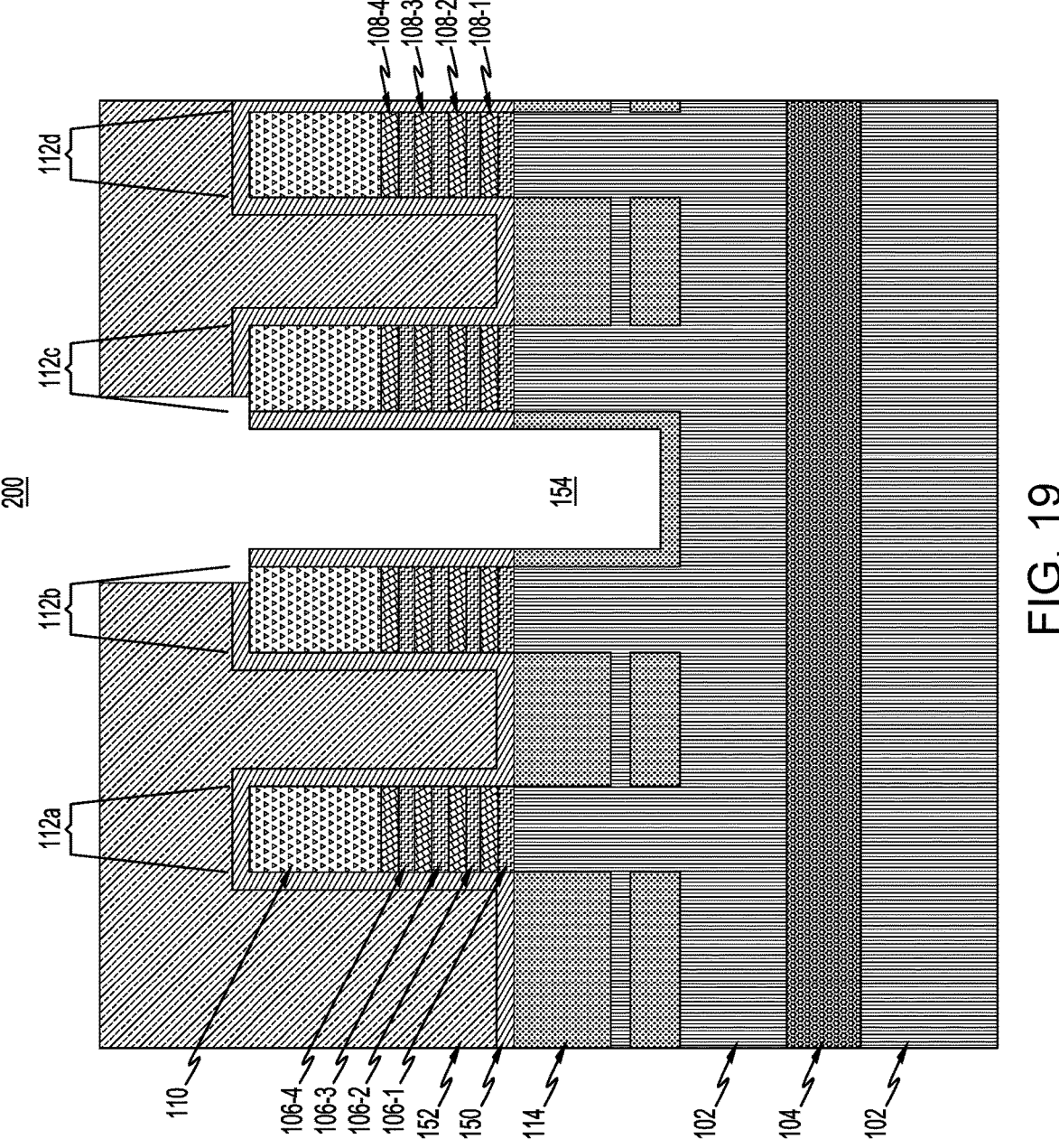
FIG. 19 depicts a side cross-sectional view of a semiconductor structure for use at a third-intermediate fabrication stage, according to the illustrative alternative embodiment.

FIG. 19 shows semiconductor structure 200 at a third-intermediate fabrication stage. During this stage, an opening 154 is formed by first depositing a mask layer 152 (such as an OPL on liner layer 150 followed by a planarization process such as CMP or other suitable planarization process. Mask layer 152 is formed using any conventional deposition process such as PVD, ALD and CVD. Mask layer 152 can be composed of a flowable organic material such as, for example, a spin-on-carbon (SOC).

Next, mask layer 152 is subjected to conventional lithographic patterning and an etching process such as, for example, RIE or other suitable etch processing. The etching process selectively etches through mask layer 152 and one of STI regions 114 between FET stacks 112b and 112c to form opening 154. A portion of the one of STI regions 114 remains in opening 154 with sidewalls of the one of STI regions 114 being aligned with sidewalls of liner layer 150. Mask layer 152 is then selectively removed by, for example, by anisotropic dry or wet etching.

Figure 20:
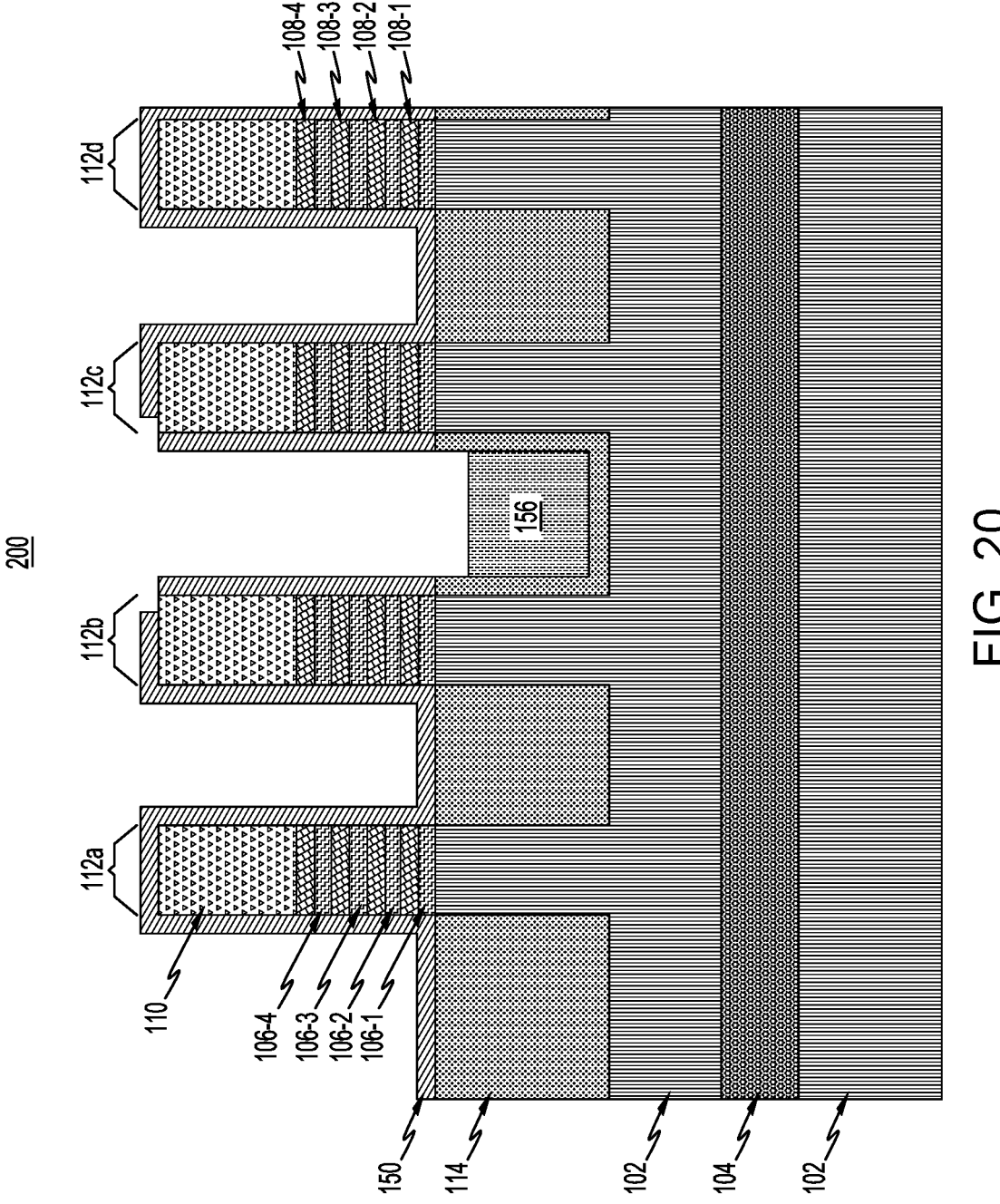
FIG. 20 depicts a side cross-sectional view of a semiconductor structure for use at a fourth-intermediate fabrication stage, according to the illustrative alternative embodiment.

FIG. 20 shows semiconductor structure 200 at a fourth-intermediate fabrication stage. During this stage, a conductive metal is deposited on a portion of the one of STI regions 114 in opening 154 using conventional deposition techniques such as PVD, ALD, CVD and plating followed by metal recess process such as etchback to form conductive spacer 156. A top surface of conductive spacer 156 is below a top surface of the one of STI regions 114 in opening 154. Suitable conductive metals can be any of those discussed above for conductive spacer 120.

Figure 21:
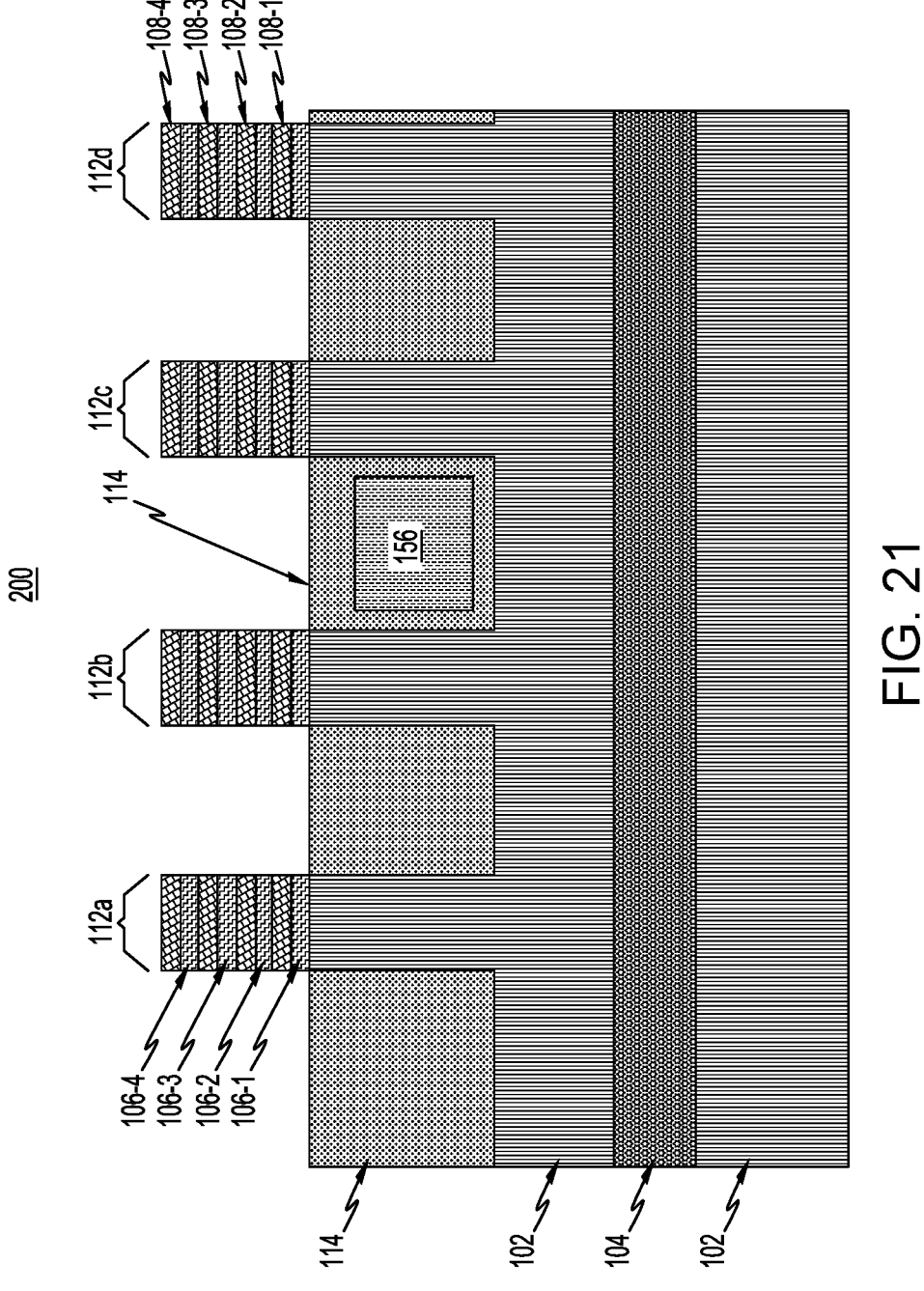
FIG. 21 depicts a side cross-sectional view of a semiconductor structure for use at a fifth-intermediate fabrication stage, according to the illustrative alternative embodiment.

FIG. 21 shows semiconductor structure 200 at a fifth-intermediate fabrication stage. During this stage, additional material of STI regions 114 is deposited on conductive spacer 156 in opening 154 using conventional deposition techniques such as CVD, PVD and ALD. Any excess of material is recessed by, for example, RIE, so that a top surface of STI region 114 is coplanar with other ones of STI region 114. In illustrative embodiments, conductive spacer 156 is embedded in the STI region 114. Mask layer 152, and liner layer 150 are then removed by anisotropic dry or wet etching.

Figure 22A:
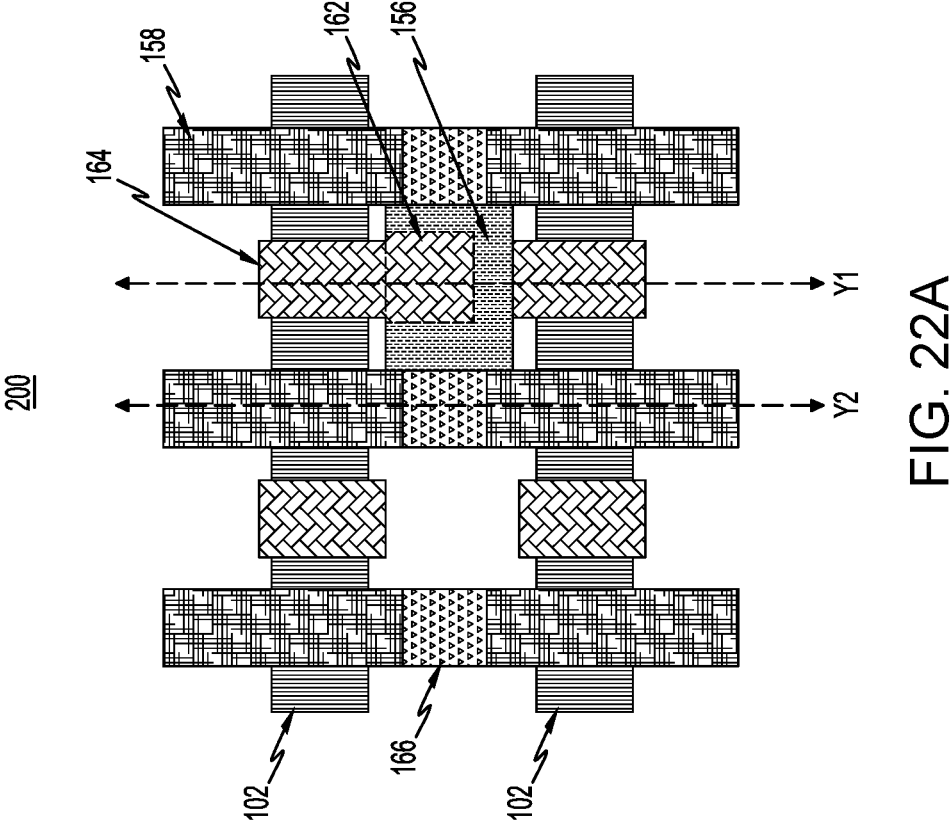
FIG. 22A depicts a top view of a semiconductor structure for use at a sixth-intermediate fabrication stage, according to the illustrative alternative embodiment.
Figure 22B:
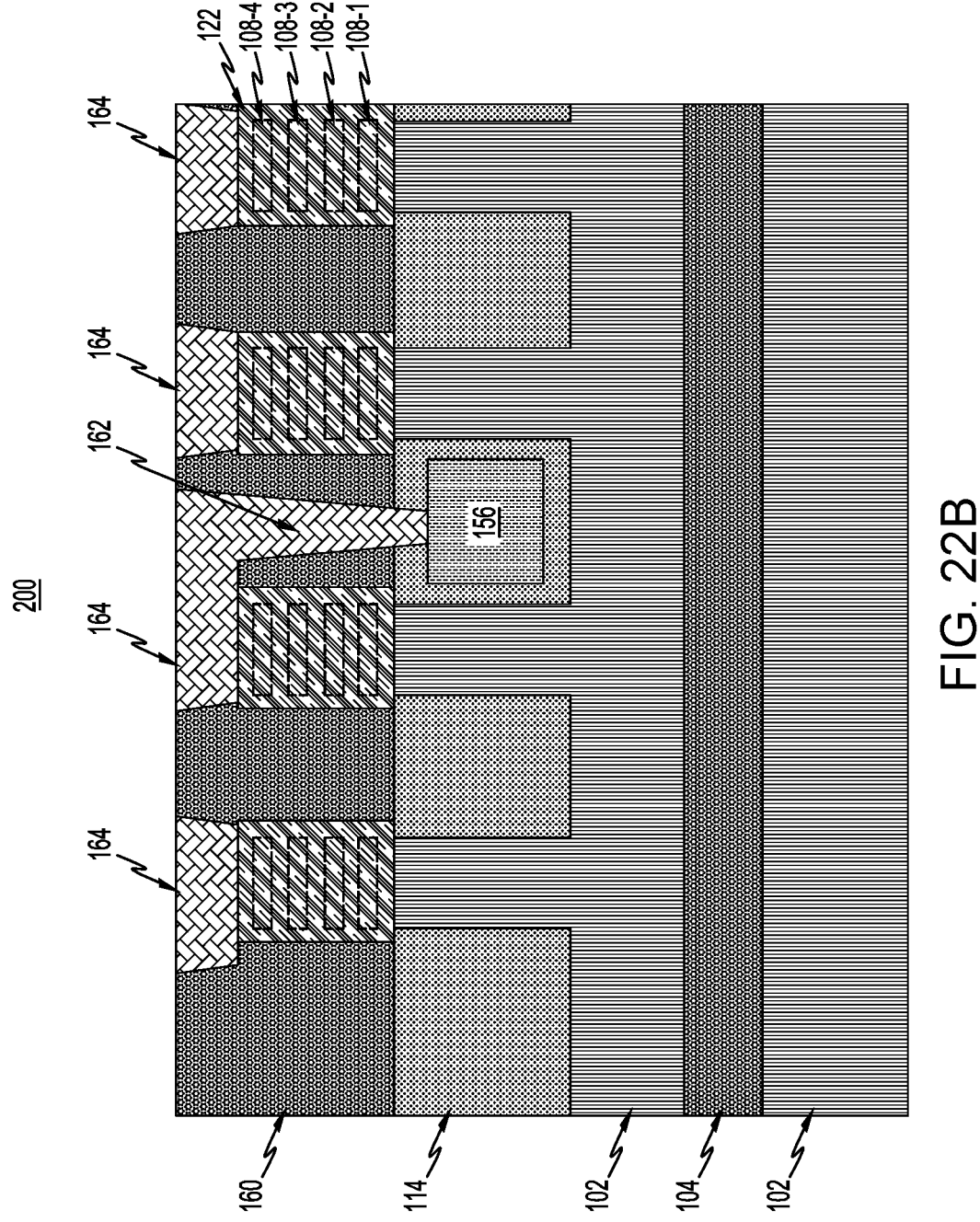
FIG. 22B depicts a side cross-sectional view of a semiconductor structure taken along the Y1-Y1 axis of FIG. 22A for use at the sixth-intermediate fabrication stage, according to the illustrative alternative embodiment.
Figure 22C:
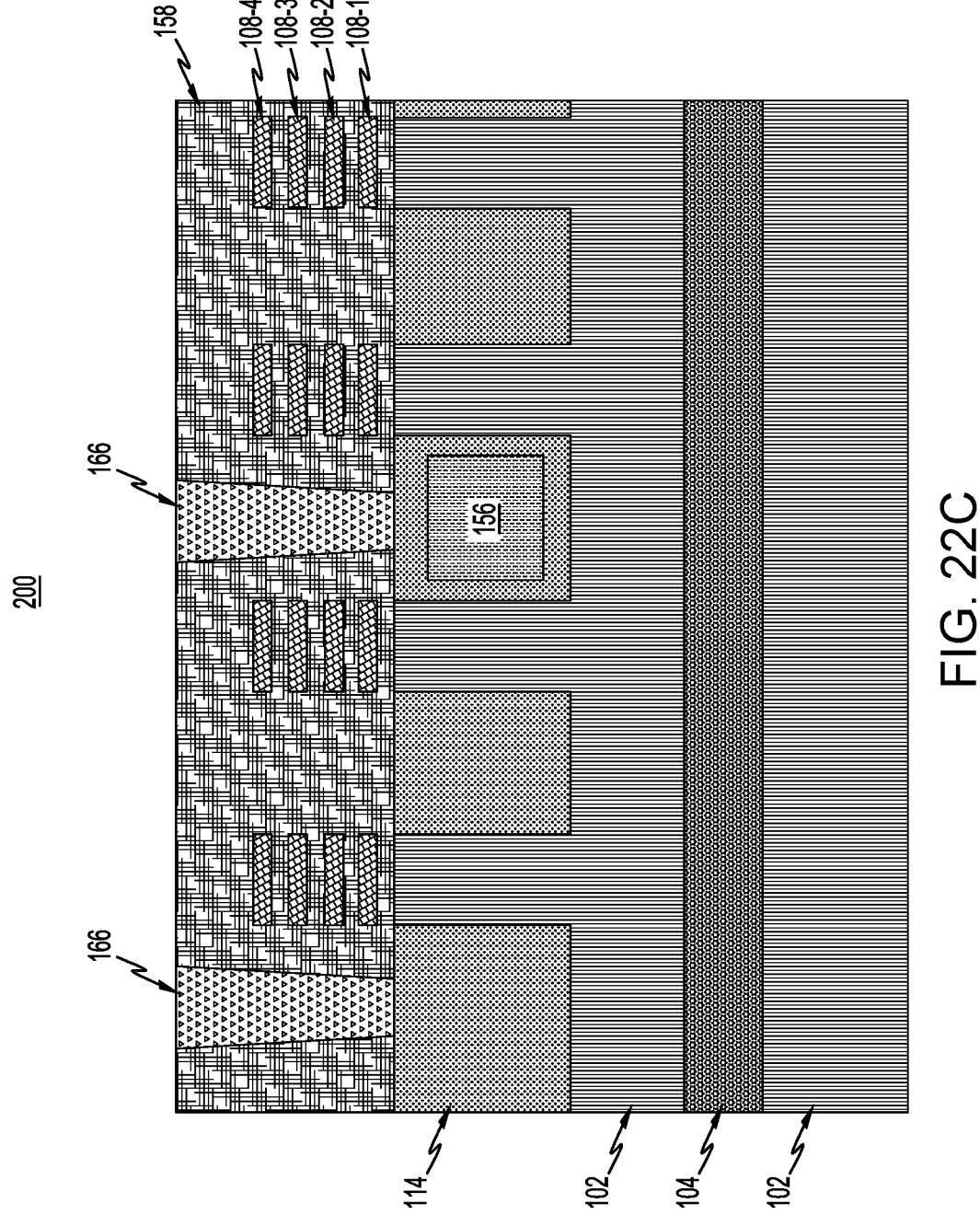
FIG. 22C depicts a side cross-sectional view of a semiconductor structure taken along the Y2-Y2 axis of FIG. 22A for use at the sixth-intermediate fabrication stage, according to the illustrative alternative embodiment.

FIGS. 22A-22C show semiconductor structure 200 at a sixth-intermediate fabrication stage. During this stage, similar processing steps as discussed above are carried out to form VBPR 162 and source/drain contacts 164 on source/drain regions 122 as shown in FIGS. 22A and 22B where a width of conductive spacer 156 is greater than a width of VBPR 162. As depicted in FIG. 22A, conductive spacer 156 is formed under the gate structure 158.

FIG. 22C shows a gate structure 158 having middle-of-the-line contacts 166 formed within gate structure 158. Gate structure 158 is formed using, for example, replacement high-k metal gate (HKMG) processing. The gate structure 158 may comprise a gate dielectric layer and a gate conductor layer. The gate dielectric layer may be formed of a high-k dielectric material. Examples of high-k dielectric materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer may have a uniform thickness in the range of 1 nm to 3 nm.

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

Middle-of-the-line contacts 166 can be formed utilizing conventional lithographic and etching processes in gate structure 158 to form vias. Next, a conductive metal is deposited in the vias to form middle-of-the-line contacts 166. Suitable conductive metals can be any of those discussed above. In various embodiments, the conductive metal can be deposited by ALD, CVD, PVD, and/or plating. The high conductance metal can be planarized using, for example, a planarizing process such as CMP. Other planarization processes can include grinding and polishing.

Figure 23:
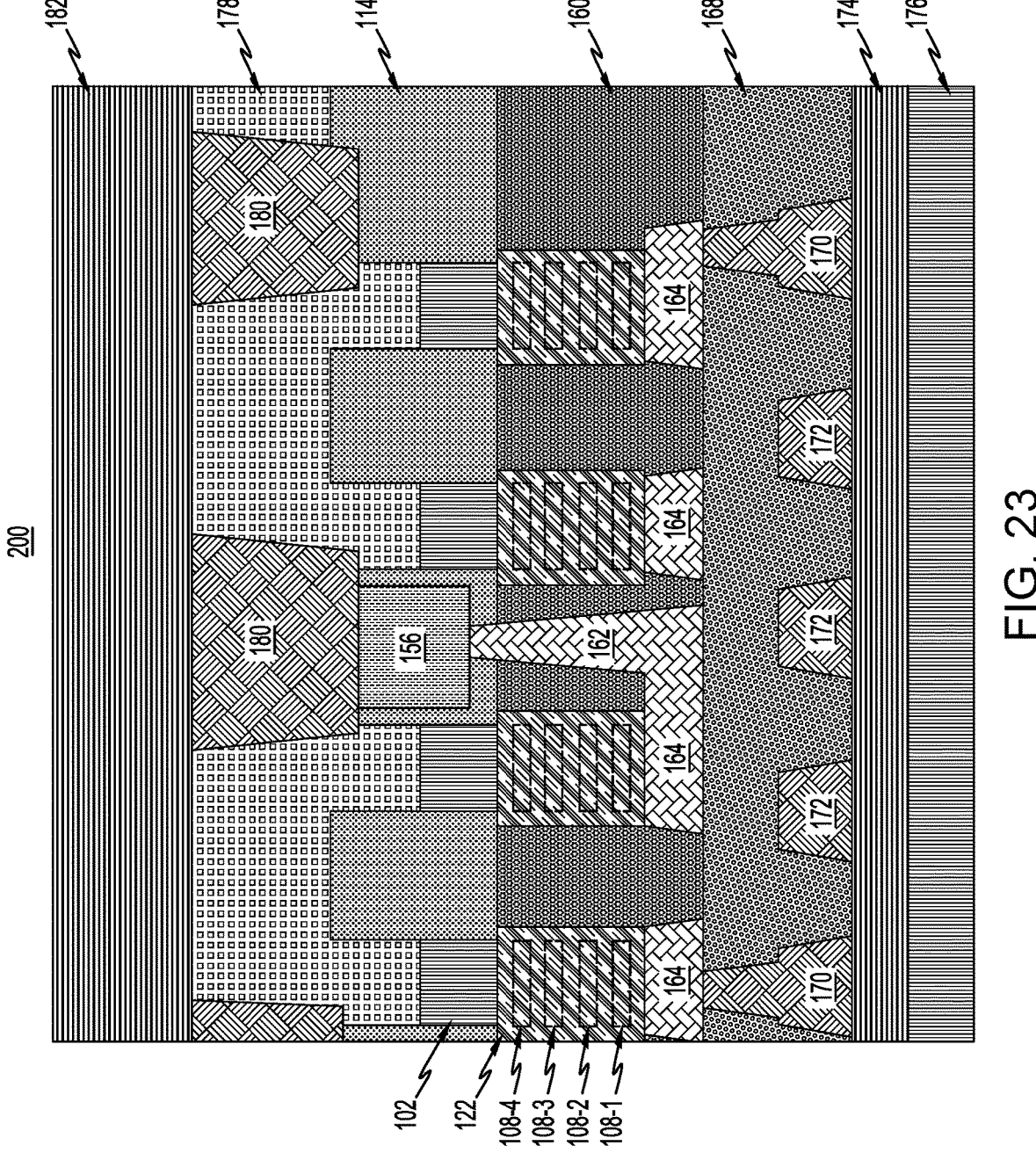
FIG. 23 depicts a side cross-sectional view of a semiconductor structure for use at a seventh-intermediate fabrication stage, according to the illustrative alternative embodiment.

FIG. 23 shows semiconductor structure 200 at a seventh-intermediate fabrication stage. During this stage, various processing steps are carried out such as those discussed above with regard to FIGS. 11-16. In illustrative embodiments, ILD layer 168 is first deposited on semiconductor structure 200, followed by patterning and etching vias in the exposed ILD layer 168. A suitable conductive metal is then deposited in the vias to form metal vias 170 and can be any conductive metal as discussed above. Conductive lines 172 are formed in ILD layer 168, the conductive line 172 being a power line connected to the semiconductor structure 200 through the metal via and middle-of-the-line contacts 166.

In illustrative embodiments, frontside BEOL interconnect 174 is formed followed by bonding of the structure (e.g., the frontside BEOL interconnect 174) to a carrier wafer 176. The frontside BEOL interconnect 174 includes various BEOL interconnect structures. For example, frontside BEOL interconnect 174 is a metallization structure that includes one or more metal layers disposed on a side of semiconductor structure 200 opposite of the side on which the backside BEOL metallization structure is disposed. The metal layers of the frontside BEOL interconnect 174 each have metal lines for making interconnections to the semiconductor device.

The carrier wafer 176 may be formed of materials similar to that of the substrate 102, and may be formed over the frontside BEOL interconnect 174 using a wafer bonding process, such as dielectric-to-dielectric bonding.

Nest, using the carrier wafer 176, the structure is "flipped" over so that the backside of the substrate 102 (i.e., the back surface) is facing up for backside processing as shown. Next, portions of the substrate 102 may be removed from the backside using, for example, a wet etch to selectively remove substrate 102 until the etch stop layer 104 is reached. The etch stop layer 104 is then selectively removed using, for example, a wet etch to selectively remove etch stop layer 104 until substrate 102 is reached. The remaining portions of the substrate 102 are removed utilizing a selective etch process such as a wet etch, followed by removal of etch stop layer 104 until substrate 102 is reached. The remaining portions of the substrate 102 are removed utilizing a selective etch process such as a wet etch.

A backside ILD layer 178 may be formed of similar processes and material as ILD layer 124. The material of the backside ILD layer 178 may initially be overfilled, followed by planarization (e.g., using CMP). Next, backside power rails 180 are formed in backside ILD layer 178 by first patterning and etching vias in the exposed backside ILD layer 178. A suitable conductive metal is then deposited in the vias and on top of backside ILD layer 178, followed by CMP to remove any metal on top of backside ILD layer 178. A suitable conductive metal can be any of the metals discussed above.

Backside power delivery network 182 is formed over the structure including backside power rails 180 and is based on creation of a wiring scheme that is disposed on both sides of the device layer (front end of line structure). For example, the power signals can be routed through a backside power delivery network 182 of metal lines coupled to the semiconductor structure to provide power to a number of semiconductor devices.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a shallow trench isolation region disposed within a semiconductor substrate;
a conductive spacer disposed within the shallow trench isolation region; and
a backside power rail disposed on a bottom surface of the conductive spacer;
wherein a bottom surface of the conductive spacer is coplanar with a bottom surface of the shallow trench isolation region.

2. The semiconductor structure of claim 1, wherein conductive spacer is disposed on a liner layer in the shallow trench isolation region.

3. The semiconductor structure of claim 1, wherein the conductive spacer is ruthenium.

4. The semiconductor structure of claim 1, further comprising a via-to-backside power rail disposed on a top surface of the conductive spacer.

5. The semiconductor structure of claim 1, wherein a top surface of the conductive spacer is coplanar with a top surface of the shallow trench isolation region.

6. A semiconductor structure, comprising:
a plurality of shallow trench isolation regions disposed within a semiconductor substrate;
a conductive spacer disposed within one of the plurality of shallow trench isolation regions; and
a via-to-backside power rail disposed on a top surface of the conductive spacer;
wherein the top surface of the conductive spacer is coplanar with a top surface of the one of the plurality of shallow trench isolation regions; and
wherein the conductive spacer has a first width and the via-to-backside power rail has a second width less than the first width.

7. The semiconductor structure of claim 6, further comprising a liner layer disposed on sidewalls of the conductive spacer.

8. The semiconductor structure of claim 6, wherein a top surface of the conductive spacer is below a top surface of the one of the plurality of shallow trench isolation regions.

9. The semiconductor structure of claim 6, further comprising a backside power rail connected to the via-to-backside power rail though the conductive spacer.

10. The semiconductor structure of claim 9, wherein the backside power rail is disposed in an interlayer dielectric layer.

11. The semiconductor structure of claim 9, further comprising a source/drain contact disposed on the via-to-backside power rail, the source/drain contact being connected to the backside power rail through the via-to-backside power rail.

12. The semiconductor structure of claim 6, further comprising a gate structure, wherein the conductive spacer is located away from the gate structure.

13. The semiconductor structure of claim 6, wherein the conductive spacer is ruthenium.

14. A semiconductor structure, comprising:
a plurality of shallow trench isolation regions disposed within a semiconductor substrate;
a conductive spacer disposed within one of the plurality of shallow trench isolation regions;
a plurality of stacked nanosheet channel layers located above the semiconductor substrate and between respective shallow trench isolation regions; and
a via-to-backside power rail disposed on a top surface of the conductive spacer;
wherein the top surface of the conductive spacer is coplanar with a top surface of the one of the plurality of shallow trench isolation regions; and
wherein the conductive spacer has a first width and the via-to-backside power rail has a second width less than the first width.

15. The semiconductor structure of claim 14, further comprising:
a source/drain region disposed on each of the plurality of stacked nanosheet channel layers; and a source/drain contact disposed on the source/drain region and connected to the via-to-backside power rail.

16. The semiconductor structure of claim 15, further comprising:

a backside power rail connected to the source/drain contact though the conductive spacer and the via-to-backside power rail.

17. The semiconductor structure of claim 16, wherein the backside power rail is disposed on one side of the conductive spacer and the via-to-backside power rail is disposed on another side of the conductive spacer.

18. The semiconductor structure of claim 14, further comprising a liner layer disposed on sidewalls of the conductive spacer.

19. The semiconductor structure of claim 17, wherein a top surface of the conductive spacer is below a top surface of the one of the plurality of shallow trench isolation regions.

20. The semiconductor structure of claim 14, wherein the conductive spacer is ruthenium.

* * * * *